United States Patent
Inoue et al.

(10) Patent No.: US 10,223,966 B2
(45) Date of Patent: Mar. 5, 2019

(54) ORGANIC EL DISPLAY DEVICE AND METHOD OF DRIVING ORGANIC EL DISPLAY DEVICE

(71) Applicant: Sharp Kabushiki Kaisha, Sakai, Osaka (JP)

(72) Inventors: Satoshi Inoue, Sakai (JP); Katsuhiro Kikuchi, Sakai (JP); Hideki Uchida, Sakai (JP); Manabu Niboshi, Sakai (JP); Yoshiyuki Isomura, Sakai (JP); Yuto Tsukamoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/319,400

(22) PCT Filed: Jun. 17, 2015

(86) PCT No.: PCT/JP2015/067438
§ 371 (c)(1),
(2) Date: Dec. 16, 2016

(87) PCT Pub. No.: WO2015/194586
PCT Pub. Date: Dec. 23, 2015

(65) Prior Publication Data
US 2017/0132971 A1    May 11, 2017

(30) Foreign Application Priority Data
Jun. 19, 2014    (JP) ................................. 2014-126400

(51) Int. Cl.
*G09G 3/20*    (2006.01)
*H01L 27/32*    (2006.01)
*G09G 3/3233*    (2016.01)

(52) U.S. Cl.
CPC ......... *G09G 3/3233* (2013.01); *G09G 3/2003* (2013.01); *G09G 3/2074* (2013.01);
(Continued)

(58) Field of Classification Search
CPC .. G09G 3/3233; G09G 3/2003; G09G 3/2074; G09G 2300/0426;
(Continued)

(56) References Cited

U.S. PATENT DOCUMENTS

2004/0036421 A1*    2/2004    Arnold ................. G09G 3/3216
                                                                    315/169.3
2006/0038501 A1    2/2006    Koyama et al.
(Continued)

FOREIGN PATENT DOCUMENTS

JP    2001-236040 A    8/2001
JP    2006-91860 A    4/2006
(Continued)

OTHER PUBLICATIONS

Official Communication issued in International Patent Application No. PCT/JP2015/067438, dated Aug. 18, 2015.

*Primary Examiner* — Mark W Regn
(74) *Attorney, Agent, or Firm* — Keating & Bennett, LLP

(57) ABSTRACT

An organic EL display device includes a plurality of sub-pixels each including a first organic EL element and a second organic EL element, a temperature information detector configured to measure current-voltage characteristics of the second organic EL element included in each of the sub-pixels, and to detect, on the basis of a result of the measurement, temperature information of the second organic EL element included in each of the sub-pixels, and a correction unit configured to correct a driving signal of the first organic EL element included in each of the sub-pixels on the basis of the temperature information of the second organic EL
(Continued)

element included in the same sub-pixel as the sub-pixel including the relevant first organic EL element.

20 Claims, 18 Drawing Sheets

(52) U.S. Cl.
CPC . *H01L 27/3262* (2013.01); *G09G 2300/0426* (2013.01); *G09G 2300/0809* (2013.01); *G09G 2310/0202* (2013.01); *G09G 2320/029* (2013.01); *G09G 2320/041* (2013.01)

(58) Field of Classification Search
CPC ... G09G 2300/0809; G09G 2310/0202; G09G 2320/029; G09G 2320/041; H01L 27/2362
USPC .......................................................... 345/694
See application file for complete search history.

(56) References Cited

U.S. PATENT DOCUMENTS

| | | |
|---|---|---|
| 2007/0215888 A1 | 9/2007 | Mitsuhashi |
| 2010/0096559 A1* | 4/2010 | Yao .................. H01L 31/09 250/372 |
| 2012/0306728 A1 | 12/2012 | Koyama et al. |

FOREIGN PATENT DOCUMENTS

| | | |
|---|---|---|
| JP | 2007-240812 A | 9/2007 |
| JP | 2007-248702 A | 9/2007 |
| JP | 2008-191611 A | 8/2008 |
| JP | 2008191611 A * | 8/2008 |
| JP | 2010-224262 A | 10/2010 |
| JP | 2010224262 A * | 10/2010 |

* cited by examiner

ORGANIC EL DISPLAY DEVICE AND METHOD OF DRIVING ORGANIC EL DISPLAY DEVICE

TECHNICAL FIELD

The present disclosure relates to an organic EL display device and a method of driving the organic EL display device.

This application is based on and claims priority of Japanese Patent Application No. 2014-126400 filed in Japan on Jun. 19, 2014, the entire contents of which are incorporated herein by reference.

BACKGROUND ART

Light emission characteristics of an organic EL display element change depending on temperature. In consideration of that point, Patent Literature (PTL) 1 proposes a technique of employing, as pixel portions for temperature detection, pixel portions positioned in a central zone and a peripheral zone of an image display region, and detecting a temperature distribution in the image display region on the basis of temperature information detected in each of the pixel portions for temperature detection.

Each of the pixel portions for temperature detection includes an organic EL element for temperature detection and an organic EL element for image display. A driving voltage is supplied to the organic EL element for temperature detection, and the temperature information of the organic EL element for temperature detection is detected on the basis of a current that flows through the organic EL element for temperature detection at that time. The temperature distribution in the image display region is calculated on the basis of the temperature information detected in the individual pixel portions for temperature detection, and a driving signal of the organic EL element for image display in each pixel portion is corrected on the basis of information of the temperature distribution.

CITATION LIST

Patent Literature

PTL 1: Japanese Unexamined Patent Application Publication No. 2007-248702

SUMMARY

Technical Problem

Because the pixel portion for temperature detection includes the organic EL element for temperature detection, the organic EL element for image display in the pixel portion for temperature detection has a smaller light emission area than an organic EL element for image display in each of other pixel portions. Thus, there is a possibility that variations in luminance may occur between the pixel portions for temperature detection and the other pixel portions, and that display quality may degrade.

Several aspects of the present invention have objects of providing an organic EL display device and a method of driving the organic EL display device, which are able to suppress a reduction of display quality, the reduction being caused by temperature change.

Solution to Problem

An organic EL display device according to a first aspect of the present invention includes a plurality of sub-pixels each including a first organic EL element and a second organic EL element, a temperature information detector configured to measure current-voltage characteristics of the second organic EL element included in each of the sub-pixels, and to detect, on the basis of a result of the measurement, temperature information of the second organic EL element included in each of the sub-pixels, and a correction unit configured to correct a driving signal of the first organic EL element included in each of the sub-pixels on the basis of the temperature information of the second organic EL element included in the same sub-pixel as the sub-pixel including the relevant first organic EL element.

In the organic EL display device according to the first aspect of the present invention, the temperature information detector may include a plurality of scanning lines disposed adjacent to each other, a plurality of measurement lines disposed adjacent to each other, the measurement lines intersecting the scanning lines, a plurality of thin film transistors disposed respectively corresponding to intersected portions where the scanning lines and the measurement lines intersect, the thin film transistors being electrically connected to the second organic EL elements included in the individual sub-pixels, respectively, a scanning line driving circuit configured to sequentially supply a gate signal to the scanning lines, a measurement line driving circuit configured to sequentially supply a constant current to the measurement lines, a voltage detection circuit configured to sequentially measure, for each of the measurement lines, a potential difference between a potential of the measurement line supplied with the current and a common potential of the second organic EL element supplied with the current from the relevant measurement line, and to detect the differential potential as a voltage applied to the second organic EL element supplied with the current from the relevant measurement line, a storage unit configured to store data regarding temperature dependency of current-voltage characteristics of the second organic EL element included in each of the sub-pixels, and a detection unit configured to detect, on the basis of the stored data, temperature information of the second organic EL element, the second organic EL element being supplied with the current from the measurement line, in accordance with the voltage detected by the voltage detection circuit.

In the organic EL display device according to the first aspect of the present invention, the temperature dependencies of the current-voltage characteristics of the second organic EL elements included in the individual sub-pixels may be equal to one another.

An organic EL display device according to a second aspect of the present invention includes a plurality of pixels each including a plurality of first organic EL elements and a second organic EL element, a temperature information detector configured to measure current-voltage characteristics of the second organic EL element included in each of the pixels, and to detect, on the basis of a result of the measurement, temperature information of the second organic EL element included in each of the pixels, and a correction unit configured to correct driving signals of the first organic EL elements included in each of the pixels on the basis of the temperature information of the second organic EL element included in the same pixel as the pixel including the relevant first organic EL elements.

In the organic EL display device according to the second aspect of the present invention, the temperature information detector may include a plurality of scanning lines disposed adjacent to each other, a plurality of measurement lines disposed adjacent to each other, the measurement lines intersecting the scanning lines, a plurality of thin film transistors disposed respectively corresponding to intersected portions where the scanning lines and the measurement lines intersect, the thin film transistors being electrically connected to the second organic EL elements included in the individual pixels, respectively, a scanning line driving circuit configured to sequentially supply a gate signal to the scanning lines, a measurement line driving circuit configured to sequentially supply a constant current to the measurement lines, a voltage detection circuit configured to sequentially measure, for each of the measurement lines, a potential difference between a potential of the measurement line supplied with the current and a common potential of the second organic EL element supplied with the current from the relevant measurement line, and to detect the differential potential as a voltage applied to the second organic EL element supplied with the current from the relevant measurement line, a storage unit configured to store data regarding temperature dependency of current-voltage characteristics of the second organic EL element included in each of the pixels, and a detection unit configured to detect, on the basis of the stored data, temperature information of the second organic EL element, the second organic EL element being supplied with the current from the measurement line, in accordance with the voltage detected by the voltage detection circuit.

In the organic EL display device according to the second aspect of the present invention, the temperature dependencies of the current-voltage characteristics of the second organic EL elements included in the individual pixels may be equal to one another.

In the organic EL display device according to the second aspect of the present invention, the pixel may include a first sub-pixel, a second sub-pixel, and a third sub-pixel, the first sub-pixel may include the first organic EL element and emit red light with driving of the first organic EL element included in the first sub-pixel, the second sub-pixel may include the first organic EL element and the second organic EL element and emit green light with driving of the first organic EL element included in the second sub-pixel, and the third sub-pixel may include the first organic EL element and emit blue light with driving of the first organic EL element included in the third sub-pixel.

An organic EL display device according to a third aspect of the present invention includes a plurality of sub-pixels each including a first organic EL element, one or more second organic EL elements, a temperature information detector configured to measure current-voltage characteristics of the one or more second organic EL elements, and to detect, on the basis of a result of the measurement, temperature information of the one or more second organic EL elements, and a correction unit configured to correct driving signals of the first organic EL elements, the first organic EL elements being included respectively in the individual sub-pixels, on the basis of the temperature information of the one or more second organic EL elements.

In the organic EL display device according to the third aspect of the present invention, the second organic EL element may be disposed plural, and the temperature information detector may include a plurality of scanning lines disposed adjacent to each other, a plurality of measurement lines disposed adjacent to each other, the measurement lines intersecting the scanning lines, a plurality of thin film transistors disposed respectively corresponding to intersected portions where the scanning lines and the measurement lines intersect, the thin film transistors being electrically connected to the second organic EL elements, respectively, a scanning line driving circuit configured to sequentially supply a gate signal to the scanning lines, a measurement line driving circuit configured to sequentially supply a constant current to the measurement lines, a voltage detection circuit configured to sequentially measure, for each of the measurement lines, a potential difference between a potential of the measurement line supplied with the current and a common potential of the second organic EL element supplied with the current from the relevant measurement line, and to detect the differential potential as a voltage applied to the second organic EL element supplied with the current from the relevant measurement line, a storage unit configured to store data regarding temperature dependency of current-voltage characteristics of the second organic EL elements, and a detection unit configured to detect, on the basis of the stored data, temperature information of the second organic EL element, the second organic EL element being supplied with the current from the measurement line, in accordance with the voltage detected by the voltage detection circuit.

In the organic EL display device according to the third aspect of the present invention, the temperature dependencies of the current-voltage characteristics of the second organic EL elements may be equal to one another.

In the organic EL display device according to any of the first to third aspects of the present invention, the organic EL display device may further include a light shielding member adapted to shield light radiated from the second organic EL element toward a viewing side.

In the organic EL display device according to any of the first to third aspects of the present invention, the light shielding member may include a light absorbing member disposed in an opposing relation to the second organic EL element.

In the organic EL display device according to any of the first to third aspects of the present invention, the light shielding member may be provided by forming an anode or a cathode of the second organic EL element as a light reflecting electrode to reflect the light radiated from the second organic EL element.

An organic EL display device driving method according to the first aspect of the present invention is a method of driving an organic EL display device including a plurality of sub-pixels, each of the sub-pixels including a first organic EL element and a second organic EL element, the method including a current and voltage measuring step of measuring current-voltage characteristics of the second organic EL element included in each of the sub-pixels, a temperature information detecting step of detecting, on the basis of a measurement result obtained in the current and voltage measuring step, temperature information of the second organic EL element included in each of the sub-pixels, and a driving signal correcting step of correcting a driving signal of the first organic EL element, the first organic EL element being included in each of the sub-pixels, on the basis of the temperature information of the second organic EL element included in the same sub-pixel as the sub-pixel including the relevant first organic EL element.

An organic EL display device driving method according to the second aspect of the present invention is a method of driving an organic EL display device including a plurality of pixels, each of the pixels including a plurality of first organic EL elements and a second organic EL element, the method including a current and voltage measuring step of measuring current-voltage characteristics of the second organic EL element included in each of the pixels, a temperature information detecting step of detecting, on the basis of a measurement result obtained in the current and voltage measuring step, temperature information of the second organic EL element included in each of the pixels, and a driving signal correcting step of correcting respective driving signals of the first organic EL elements, the first organic EL elements being included in each of the pixels, on the basis of the temperature information of the second organic EL element included in the same pixel as the pixel including the relevant first organic EL elements.

An organic EL display device driving method according to the third aspect of the present invention is a method of driving an organic EL display device including a plurality of sub-pixels and one or more second organic EL elements, each of the sub-pixels including a first organic EL element, the method including a current and voltage measuring step of measuring current-voltage characteristics of the one or more second organic EL elements, a temperature information detecting step of detecting, on the basis of a measurement result obtained in the current and voltage measuring step, temperature information of the one or more second organic EL elements, and a driving signal correcting step of correcting respective driving signals of the first organic EL elements, the first organic EL elements being included in each of the sub-pixels, on the basis of the temperature information of the one or more second organic EL elements.

Advantageous Effects of Invention

According to the several aspects of the present invention, the organic EL display devices and the methods of driving the organic EL display device are obtained which are able to suppress a reduction of display quality, the reduction being caused by temperature change.

DESCRIPTION OF EMBODIMENTS

[First Embodiment]

Figure 1:
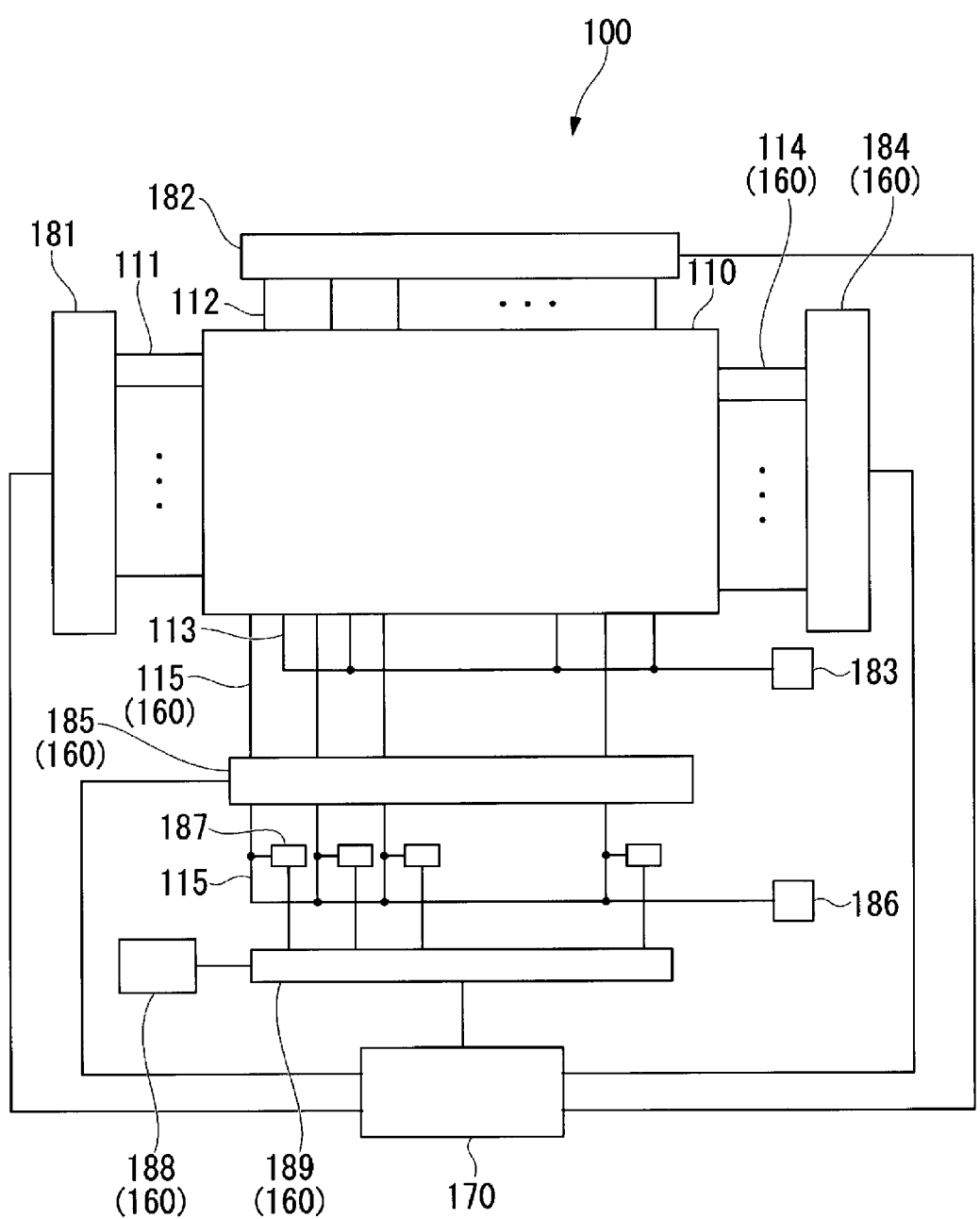
FIG. 1 is a block diagram illustrating an entire configuration of an organic EL display device according to a first embodiment.
Figure 2:
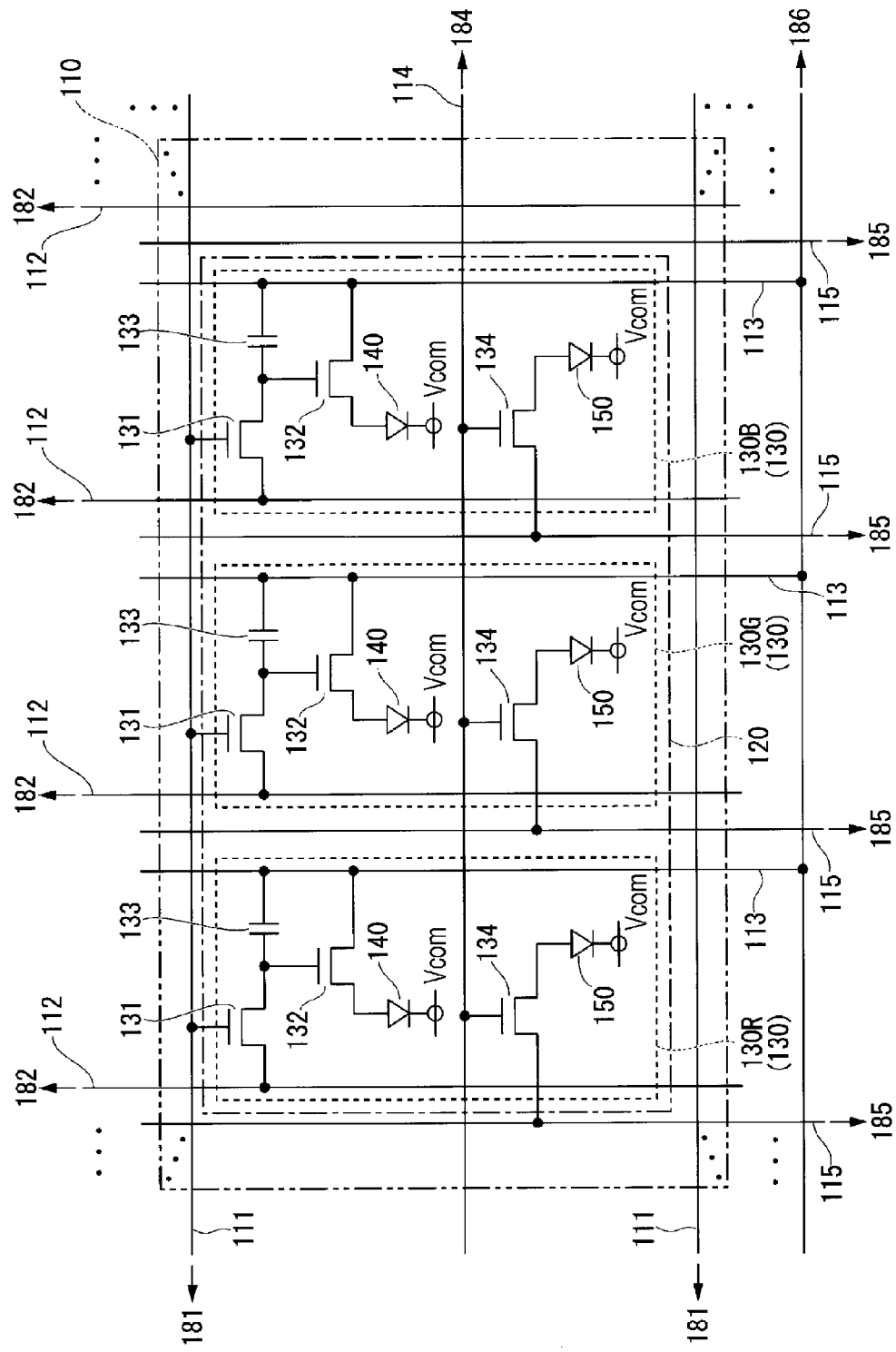
FIG. 2 is an equivalent circuit diagram illustrating a circuit configuration of the organic EL display device according to the first embodiment.
Figure 3A:
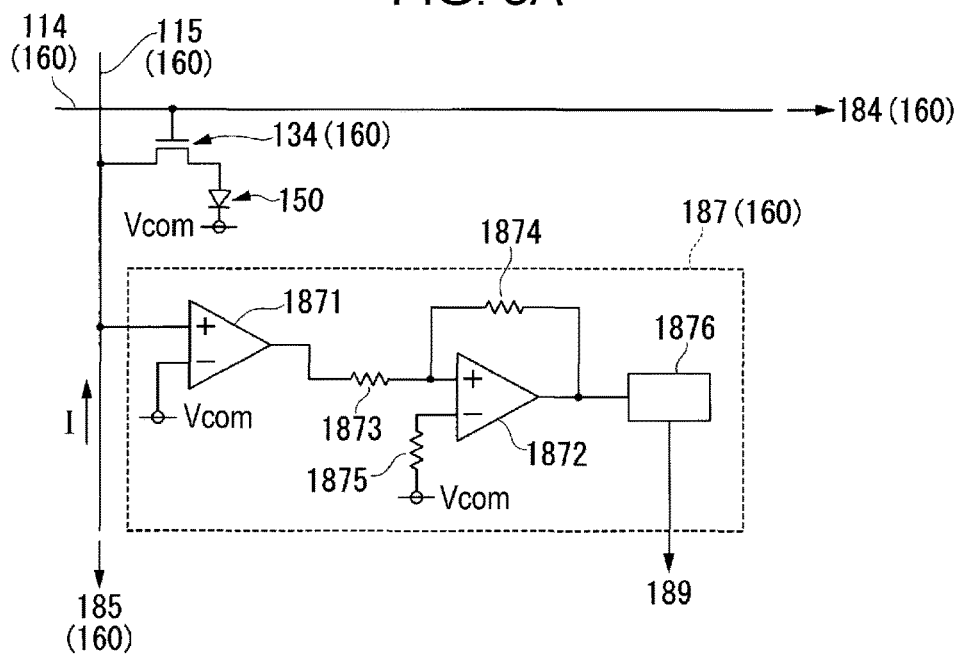
FIG. 3A is a first diagram referenced to explain a method of measuring a voltage of an organic EL element and detecting a temperature.
Figure 3B:
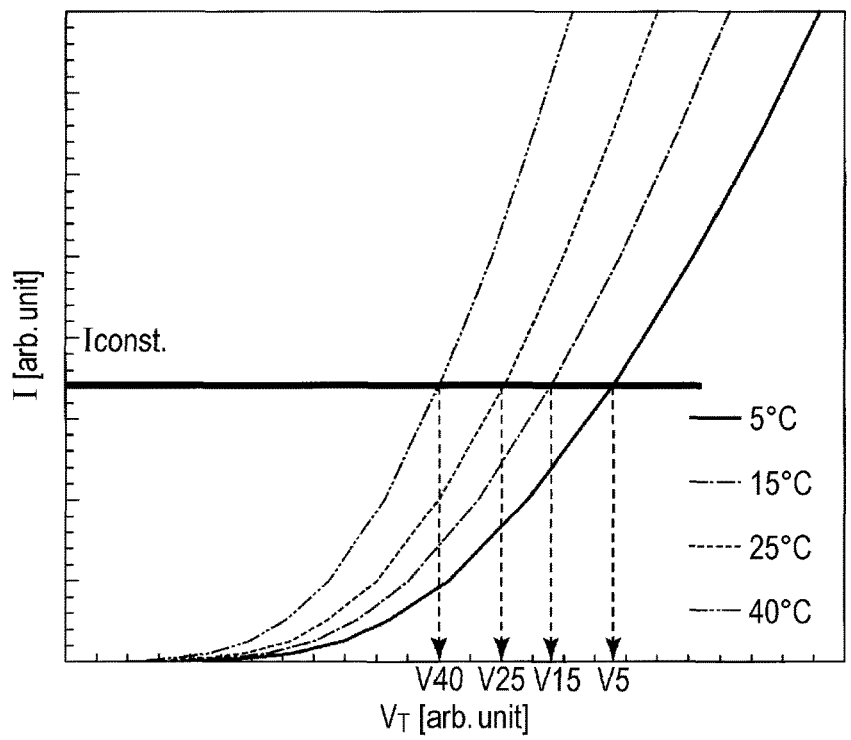
FIG. 3B is a second diagram referenced to explain the method of measuring a voltage of an organic EL element and detecting a temperature.
Figure 4:
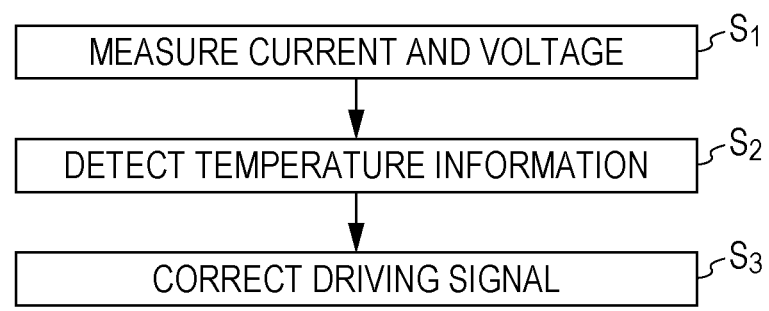
FIG. 4 is a flowchart referenced to explain a method of driving the organic EL display device 100.
Figure 5:
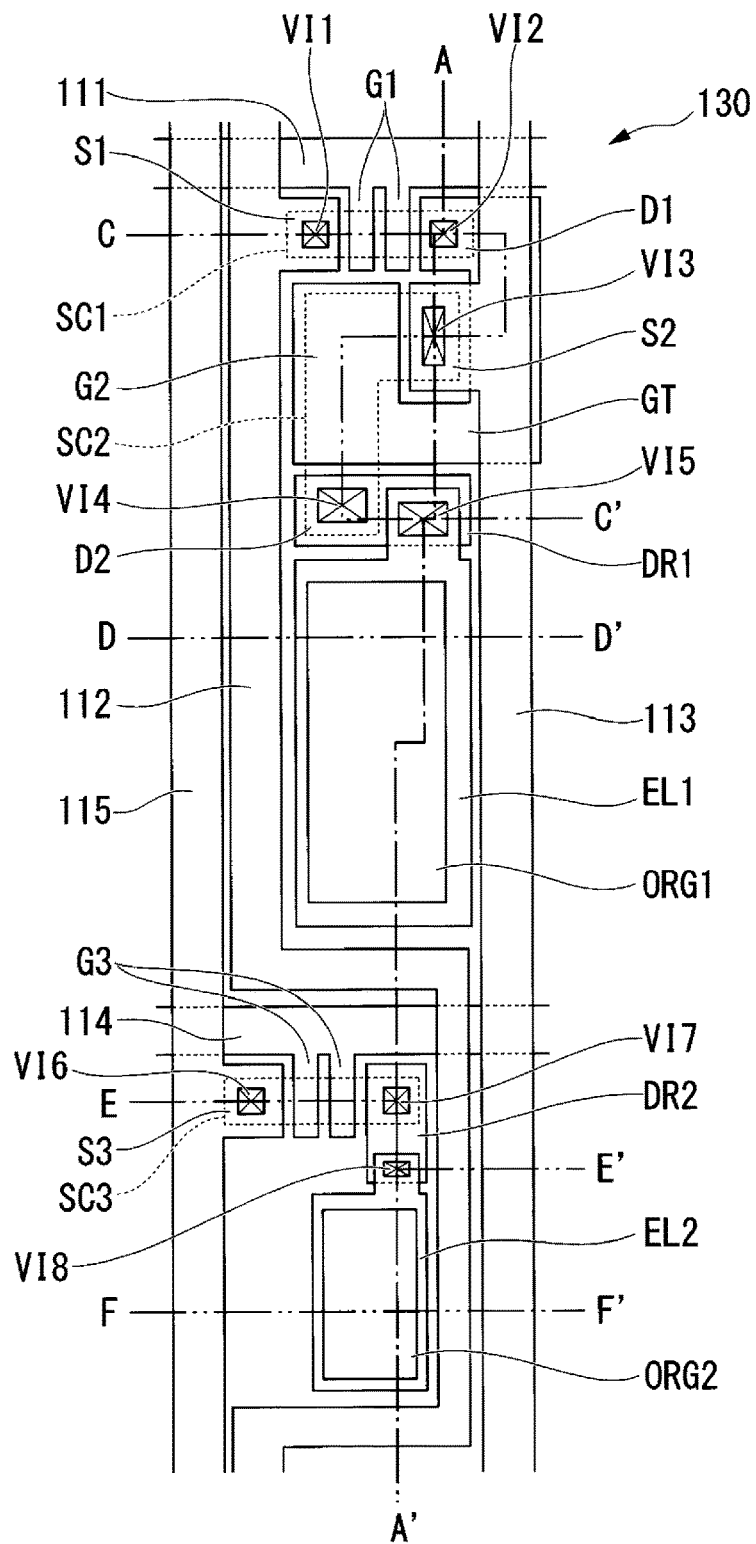
FIG. 5 is a plan view illustrating a planar structure of arbitrary one of sub-pixels in the organic EL display device according to the first embodiment.
Figure 10:
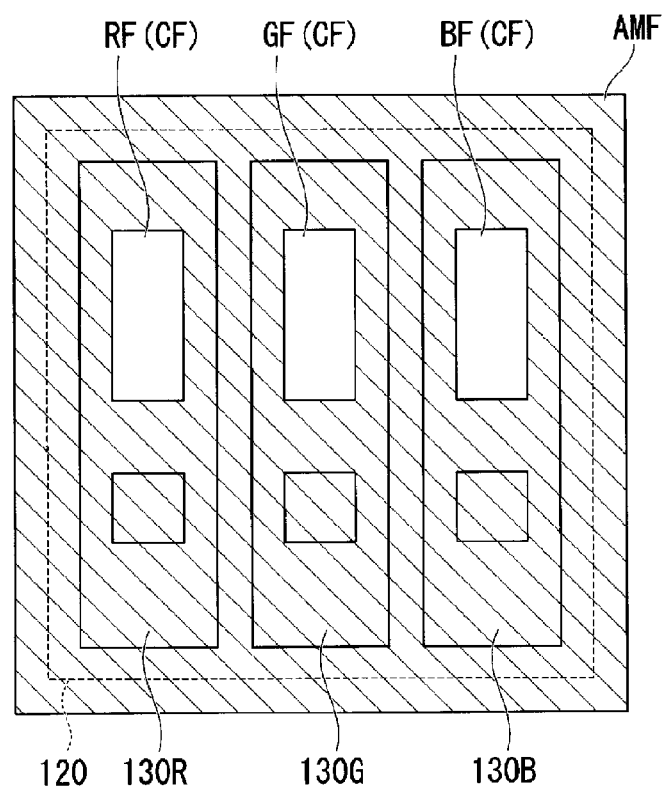
FIG. 10 is a sectional view illustrating a planar structure of a pixel in the organic EL display device according to the first embodiment.
Figure 11A:
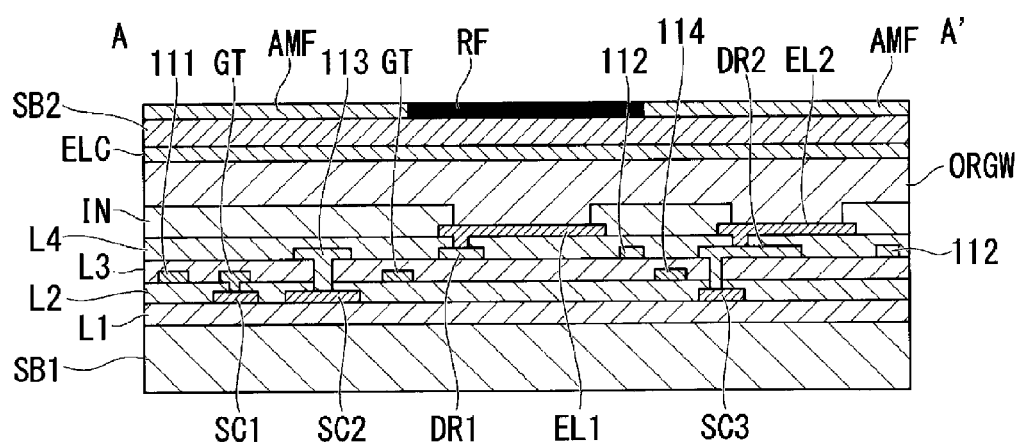
FIG. 11A is a first sectional view illustrating a sectional structure of a sub-pixel in the organic EL display device according to the first embodiment.
Figure 11B:
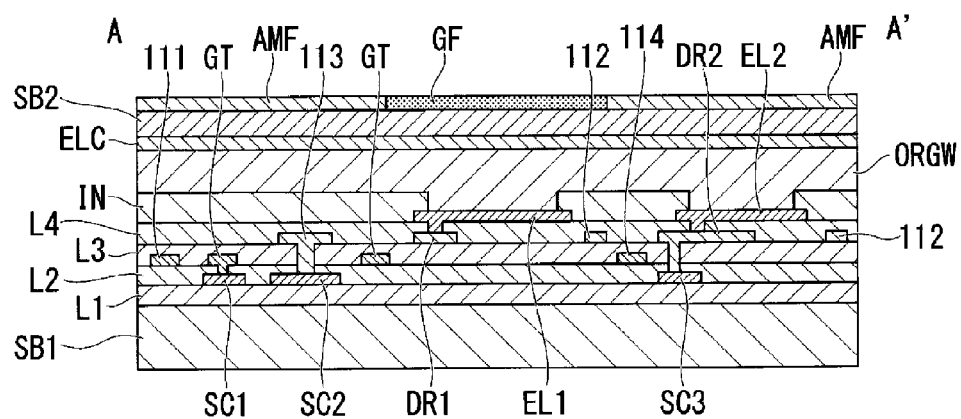
FIG. 11B is a second sectional view illustrating a sectional structure of a sub-pixel in the organic EL display device according to the first embodiment.
Figure 11C:
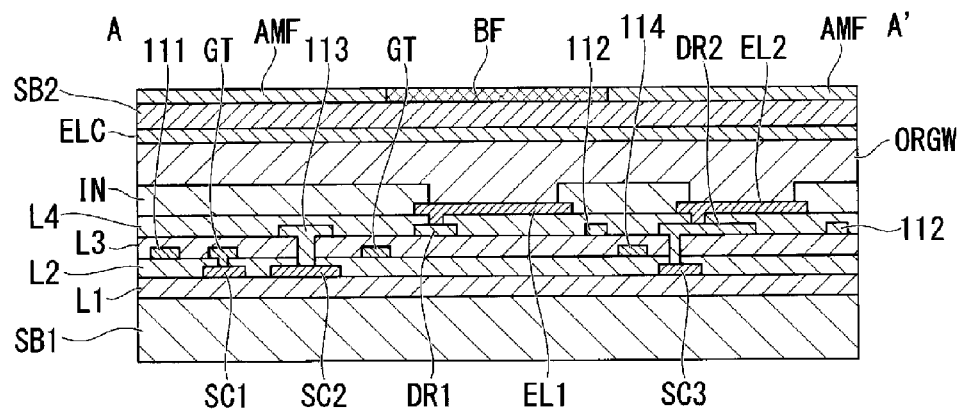
FIG. 11C is a third sectional view illustrating a sectional structure of a sub-pixel in the organic EL display device according to the first embodiment.

A first embodiment of the present invention will be described below with reference to FIGS. 1 to 11C. FIG. 1 is a block diagram illustrating an entire configuration of an organic EL display device 100. FIG. 2 is an equivalent circuit diagram illustrating a circuit configuration of the organic EL display device 100. FIGS. 3A and 3B are diagrams referenced to explain a method of measuring a voltage of an organic EL element and detecting a temperature. FIG. 4 is a flowchart referenced to explain a method of driving the organic EL display device 100. FIG. 5 is a plan view illustrating a planar structure of a sub-pixel 130. FIGS. 6 to 9 are each a sectional view illustrating a sectional structure of the sub-pixel 130. FIG. 10 is a plan view of a pixel 120. FIGS. 11A to 11C are sectional views illustrating sectional structures of sub-pixels 130R, 130G and 130B included in the pixel 120.

As illustrated in FIG. 1, the organic EL display device 100 includes a rectangular display region 110, a temperature information detector 160, and a control unit 170.

(Display of Image)

The organic EL display device 100 includes a plurality of first scanning lines 111, a plurality of data lines 112, and a plurality of power lines 113. The first scanning lines 111 are disposed adjacent to each other with a predetermined interval held between every adjacent two lines. The data lines 112 are disposed adjacent to each other with a predetermined interval held between every adjacent two lines in a state intersecting the first scanning lines 111. The power lines 113 are disposed adjacent to each other with a predetermined interval held between every adjacent two lines in a state extending in a direction substantially parallel to the data lines 112.

The organic EL display device 100 includes a scanning line driving circuit (first scanning line driving circuit) 181 to which the first scanning lines 111 are connected, a data line driving circuit 182 to which the data lines 112 are connected, and a power supply 186 to which the power lines 113 are connected. The scanning line driving circuit 181, the data line driving circuit 182, and the power supply 183 are arranged around the display region 110.

The scanning line driving circuit 181 is arranged at a position spaced from the display region 110 in an opposing relation to a first side (e.g., a short side) of the display region 110. The data line driving circuit 182 is arranged at a position spaced from the display region 110 in an opposing relation to a second side (e.g., a long side) of the display region 110, the second side being perpendicular to the first side.

As illustrated in FIG. 2, a plurality of sub-pixels 130 are disposed respectively corresponding to intersected portions where the first scanning lines 111 and the data lines 112 intersect. The sub-pixels 130 are arrayed in such a matrix pattern that a direction in which the first scanning lines 111 extend in parallel is defined as a row direction, and that a direction in which the data lines 112 extend in parallel is defined as a column direction. The display region 110 is formed by the sub-pixels 130 arrayed in the matrix pattern.

The sub-pixels 130 are grouped depending on colors to be displayed by the individual sub-pixels 130. The sub-pixels 130 are grouped, for example, into three types of sub-pixels 130R, 130G and 130B. The sub-pixel 130R is, for example, a sub-pixel displaying red (R). The sub-pixel 130G is, for example, a sub-pixel displaying green (G). The sub-pixel 130B is, for example, a sub-pixel displaying blue (B). The sub-pixels 130R, 130G and 130B are periodically arrayed in the mentioned order in the column direction. The three sub-pixels 130R, 130G and 130B, which are arrayed adjacent to each other in the column direction, constitute one pixel 120. The display region 110 includes a plurality of pixels 120 arrayed in a matrix pattern.

The sub-pixels 130 include first organic EL elements 140 and color filters, respectively.

In this embodiment, the first organic EL elements 140 are each a white luminescent element configured to emit white light. Colored representation is made with the color filter performing color conversion of the white light emitted from the first organic EL element 140.

In each of the sub-pixels 130, a gate of a first thin film transistor 131 is connected to the first scanning line 111, a source thereof is connected to the data line 112, and a drain thereof is connected to a gate of a second thin film transistor 132, respectively. A capacitance element 133 is connected between the gate of the second thin film transistor 132 and the power line 113. A source of the second thin film transistor 132 is connected to the power line 113. A drain of the second thin film transistor 132 is connected to an anode of the first organic EL element 140. Cathodes of the individual first organic EL elements 140 are all connected to a not-illustrated common wiring line. Thus, potentials of all the cathodes of the first organic EL elements 140 are set to a common potential $V_{COM}$.

The first scanning lines 111 are driven by the scanning line driving circuit 181 (see FIG. 1). The scanning line driving circuit 181 is controlled by the control unit 170 (see FIG. 1), and it sequentially supplies a gate signal (first gate signal) to the first scanning lines 111 at a predetermined period. As a result, the first scanning lines 111 are selected sequentially.

The data lines 112 are driven by the data line driving circuit 182 (see FIG. 1).

The data line driving circuit 182 is controlled by the control unit 170 (see FIG. 1), and it sequentially supplies a driving signal to the data lines 112 at a predetermined period. The driving signal designates an amount of light emitted from the first organic EL element 140.

The driving signal is held in the capacitance element 133 through the first thin film transistor 131 that has been turned to an ON state in accordance with the gate signal. During a period in which the driving signal is held in the capacitance element 133, the second thin film transistor 132 is held in an ON state. A current flows from the power line 113 to the first organic EL element 140 through the second thin film transistor 132 that has been turned to the ON state. As a result, the first organic EL element 140 emits light. A magnitude of the current flowing to the first organic EL element 140 is determined depending on a magnitude of the driving signal, and the amount of the light emitted from the first organic EL element 140 is changed depending on the magnitude of the current.

(Detection of Temperature Information)

The temperature information detector 160 will be described below with reference to FIGS. 1 to 3B. As illustrated in FIG. 1, the temperature information detector 160 includes a plurality of second scanning lines 114, a plurality of measurement lines 115, a scanning line driving circuit (second scanning line driving circuit) 184, a measurement line driving circuit 185, a voltage detection circuit 187, a storage unit 188, and a detection unit 189.

The second scanning lines 114 are disposed adjacent to each other with a predetermined interval held between every adjacent two lines. The measurement lines 115 are disposed adjacent to each other with a predetermined interval held between every adjacent two lines in a state intersecting the second scanning lines 114.

The second scanning lines 114 are connected to the scanning line driving circuit 184. The scanning line driving circuit 184 is controlled by the control unit 170, and it sequentially supplies a gate signal (second gate signal) to the second scanning lines 114. The measurement lines 115 are connected to the measurement line driving circuit 185 and the power supply 186. The measurement line driving circuit 185 is controlled by the control unit 170, and it sequentially supplies a current I having a constant magnitude to the measurement lines 115 from the power supply 186.

As illustrated in FIG. 2, the sub-pixels 130 include respectively second organic EL elements 150 and third thin film transistors 134. The third thin film transistor 134 is included in the temperature information detector 160.

In this embodiment, each sub-pixel 130R includes the second organic EL element 150 and the third thin film transistor 134. Each sub-pixel 130G includes the second organic EL element 150 and the third thin film transistor 134. Each sub-pixel 130B includes the second organic EL element 150 and the third thin film transistor 134.

The third thin film transistors 134 are disposed respectively corresponding to intersected portions where the second scanning lines 114 and the measurement lines 115 intersect. In each of the sub-pixels 130, the third thin film transistor 134 is electrically connected to the second organic EL element 150. A gate of the third thin film transistor 134 is connected to the second scanning line 114. A source of the third thin film transistor 134 is connected to the measurement line 115. A drain of the third thin film transistor 134 is connected to an anode of the second organic EL element 150. Cathodes of the individual second organic EL elements 150 are all connected to a not-illustrated common wiring line. Thus, potentials of all the cathodes of the second organic EL element 150 are set to a common potential $V_{COM}$.

With the scanning line driving circuit 184 sequentially supplying the gate signal to the second scanning lines 114, the gates of the third thin film transistors 134 are sequentially turned to an ON state. The measurement line driving circuit 185 sequentially supplies the current I to the measurement lines 115, whereby the current I sequentially flows to the second organic EL elements 150 connected to the measurement lines 115 through the third thin film transistors 134 of which gates have been turned to the ON state.

Returning to FIG. 1, the voltage detection circuit 187 sequentially measures, for each of the measurement lines 115, a potential difference $\Delta V$ ($=V_M - V_{COM}$) between a potential $V_M$ of the measurement line 115 supplied with the current I and the common potential $V_{COM}$ of the second organic EL element 150 supplied with the current I from the measurement line 115.

The voltage detection circuit 187 detects the potential difference $\Delta V$ as a voltage $V_T$ applied to the second organic EL element 150 to which the current I has been supplied from the measurement line 115. The ON resistance between the gate and the source of the third thin film transistor 134 and the ON resistance of the measurement line driving circuit 185 are as small as negligible.

The voltage detection circuit 187 includes, for each of the measurement lines 115, an operational amplifier circuit as illustrated in FIG. 3A, for example. The voltage detection circuit 187 includes operational amplifiers 1871 and 1872, resistances 1873, 1874 and 1875, and an AD converter 1876. A non-inverting input terminal (+) of the operational amplifier 1871 is connected to the measurement line 115, and an inverting input terminal (−) thereof is connected to the common potential $V_{COM}$. A signal in proportion to the potential difference $\Delta V$, i.e., a differential input voltage, is obtained from an output terminal of the operational amplifier 1871. This output signal is further amplified in an inverting amplifier circuit that is constituted by the operational amplifier 1872 and the resistances 1873, 1874 and 1875. In the inverting amplifier circuit, an output terminal of the operational amplifier 1871 is connected to one end of the resistance 1873. The other end of the resistance 1873 is connected to a non-inverting input terminal (+) of the operational amplifier 1872 and to one end of the resistance 1874. An inverting input terminal (−) of the operational amplifier 1872 is connected to the common potential $V_{COM}$ through the resistance 1875. An output terminal of the operational amplifier 1872 is connected to the other end of the resistance 1874 and to an input terminal of the AD converter 1876. A magnitude $R_{1873}$ of the resistance 1873 and a magnitude $R_{1874}$ of the resistance 1874 are set to satisfy $R_{1873} < R_{1874}$. The magnitude of a signal output from the operational amplifier 1871 is amplified ($R_{1874}/R_{1873}$) times in the inverting amplifier circuit. The signal having been amplified in the inverting amplifier circuit is converted to a digital signal by the AD converter 1876 and is sent to the detection unit 189 from an output terminal of the AD converter 1876.

Returning to FIG. 1, the storage unit 188 stores data regarding temperature dependency of current-voltage characteristics of the second organic EL element 150 (see FIG. 2). As plotted in FIG. 3B, the voltage $V_T$ applied to the second organic EL element 150 changes depending on temperature change under condition that a constant current value ($I_{CONST}$ in FIG. 3B) is supplied.

The detection unit 189 detects temperature information of the second organic EL element 150 to which the current I is supplied from the measurement line 115. The detection of the temperature information of the second organic EL element 150 is performed on the basis of the data regarding the temperature dependency of the current-voltage characteristics of the second organic EL element 150. The detection unit 189 receives a value of the voltage $V_T$, which has been detected by the voltage detection circuit 187, from the voltage detection circuit 187. The detection unit 189 refers to the data regarding the temperature dependency of the current-voltage characteristics of the second organic EL element 150, and finds a value of a temperature T corresponding to the value of the voltage $V_T$.

Because the first organic EL element 140 and the second organic EL element 150 both arranged in the same sub-pixel 130 are close to each other, the temperature information of the second organic EL element 150 can be regarded as being approximate to that of the first organic EL element 140 arranged in the same sub-pixel. On the premise of such approximation, the detection unit 189 detects the found value of the temperature T as the temperature information of the second organic EL element 150.

The detection of the temperature information is generally performed in a manner of first obtaining data (I, $V_T$) of the applied current and the measured voltage with respect to the organic EL element 150, and then finding a temperature corresponding to the data (I, $V_T$) (namely, finding a temperature providing a curve that passes a point (I, $V_T$) on the graph of FIG. 3B). In the case of using such a manner, however, it is required to refer to three types of data (I, $V_T$, T), i.e., current, voltage, and temperature, in a process of detecting the temperature information.

In this embodiment, the second organic EL element 150 used for temperature measurement is driven independently of the first organic EL element 140 used for image display. The second organic EL element 150 is always driven at the constant current I regardless of the driving signal that is sent to each of the first organic EL elements 140.

Accordingly, in the process of detecting the temperature information, it is sufficient to refer to two types of data ($V_T$, T), i.e., voltage and temperature, under the condition of a certain specific value of the current I.

Thus, instead of the three types of data, i.e., current, voltage, and temperature, the two types of data, i.e., voltage and temperature, under the constant current I are sufficient as the data to be used in the process of detecting the temperature information. As a result, a volume of data to be referred to can be reduced, and the detection of the temperature information can be performed easily and promptly.

Furthermore, in this embodiment, the temperature dependencies of the current-voltage characteristics of the second organic EL elements 150 included in the individual sub-pixels 130 are equal to one another. Therefore, the data regarding the temperature dependency of the current-voltage characteristics of the second organic EL element 150 can be utilized in common to all the second organic EL elements 150. As a result, data capacity to be stored can be reduced.

The control unit 170 executes a correction calculation of the driving signal on the basis of the temperature information detected by the detection unit 189. The control unit 170 sends a correction result of the driving signal to the data line driving circuit 182 for each of the sub-pixels 130. The control unit 170 functions as a correction unit configured to correct the driving signal of the first organic EL element 140, the first organic EL element 140 being included in each of the sub-pixels 130, on the basis of the temperature information of the second organic EL element 150 included in the same sub-pixel 130 as that including the relevant first organic EL element 140. As a result, appropriate driving signals adapted for temperatures can be supplied to the individual sub-pixel 130.

(Driving Method)

A method of driving the organic EL display device 100 will be described below with reference to FIG. 4.

First, respective current-voltage characteristics of the second organic EL elements 150 included in the individual sub-pixels 130 are measured with the voltage detection circuit 187 (current and voltage measurement step S1). In the current and voltage measurement step S1, the gate signals are sequentially supplied from the second scanning lines 114, and the constant current I is sequentially supplied from the measurement line 115. The potential difference $\Delta V$ between the potential $V_M$ of the measurement line 115 supplied with the current I and the common potential $V_{COM}$ of the second organic EL element 150 supplied with the current I from the measurement line 115 is sequentially measured for each of the measurement lines 115. The potential difference $\Delta V$ is detected as the voltage applied to the second organic EL element 150 to which the current I has been supplied from the measurement line 115.

Then, the temperature information of the second organic EL element 150, which is included in each of the sub-pixels 130, is detected on the basis of a measurement result obtained in the current and voltage measurement step S1 (temperature information detecting step S2). In the temperature information detecting step S2, the data regarding the temperature dependency of the current-voltage characteristics of the second organic EL element 150, which is included in each of the sub-pixels 130, is obtained from the storage unit 188. On the basis of the obtained data, the temperature information of the second organic EL element 150, to which the current I has been supplied from the measurement line 115, is detected in accordance with the potential difference $\Delta V$ detected by the voltage detection circuit 187.

Then, the driving signal of the first organic EL element 140, which is included in each of the sub-pixels 130, is corrected on the basis of the temperature information of the second organic EL element 150 included in the same sub-pixel 130 as that including the relevant first organic EL element 140 (driving signal correcting step S3).

The luminance of the first organic EL element 140 can be corrected on the basis of the temperature information by sequentially executing the above-described steps for each of the sub-pixels 130.

(Detailed Structure)

A detailed structure of the organic EL display device 100 will be described below with reference to FIGS. 5 to 11C.

FIG. 5 illustrates a planar structure of an arbitrary one of the sub-pixels 130. A branch portion S1 branched from the data line 112 is contacted with a semiconductor region SC1 through an upper- and lower-pattern connecting portion VI1, and it forms a source electrode of the first thin film transistor 131. A branch portion G1 branched from the first scanning line 111 is disposed in a state electrically insulated from the semiconductor region SC1, and it forms a gate electrode of the first thin film transistor 131. One end portion D1 of an intermediate wiring line GT is contacted with the semiconductor region SC1 through an upper- and lower-pattern connecting portion VI2, and it forms a drain electrode of the first thin film transistor 131. The semiconductor region SC1 is formed of N-type polysilicon, for example.

A branch portion S2 branched from the power line 113 is contacted with a semiconductor region SC2 through an upper- and lower-pattern connecting portion VI3, and it forms a source electrode of the second thin film transistor 132. The other end portion G2 of the intermediate wiring line GT is disposed in a state electrically insulated from the semiconductor region SC2, and it forms a gate electrode of the second thin film transistor 132. One end portion D2 of an intermediate wiring line DR1 is contacted with a semiconductor region SC2 through an upper- and lower-pattern connecting portion VI4, and it forms a drain electrode of the second thin film transistor 132. The semiconductor region SC2 is formed of P-type polysilicon, for example.

An electrode EL1 is contacted with the other end portion of the intermediate wiring line DR1 through an upper- and lower-pattern connecting portion VI5, and it forms the anode of the first organic EL element 140. The cathode of the first organic EL element 140 is connected to the not-illustrated common wiring line.

A branch portion S3 branched from the measurement line 115 is contacted with a semiconductor region SC3 through an upper- and lower-pattern connecting portion VI6, and it forms a source electrode of the third thin film transistor 134. A branch portion G3 branched from the second scanning line 114 is disposed in a state electrically insulated from the semiconductor region SC3, and it forms a gate electrode of the third thin film transistor 134. One end portion D3 of an intermediate wiring line DR2 is contacted with the semiconductor region SC3 through an upper- and lower-pattern connecting portion VI7, and it forms a drain electrode of the third thin film transistor 134. The semiconductor region SC3 is formed of N-type polysilicon, for example.

An electrode EL2 is contacted with the other end portion DR2 of the intermediate wiring line through an upper- and lower-pattern connecting portion VI8, and it forms the anode of the second organic EL element 150. The cathode of the second organic EL element 150 is connected to the not-illustrated common wiring line.

In this embodiment, an organic layer ORG1 (see FIG. 7) forming the first organic EL element 140 and an organic layer ORG2 (see FIG. 9) forming the second organic EL element 150 are formed of the same organic material ORGW. More specifically, the first organic EL elements 140 included in the sub-pixels 130R, 130G and 130B are all made of the white luminescent material ORGW. Furthermore, the second organic EL elements 150 included in the sub-pixels 130R, 130G and 130B are also all made of the white luminescent material ORGW. The organic layers ORG1 and ORG2 are each a part of a thin film of the organic material ORGW.

Figure 6:
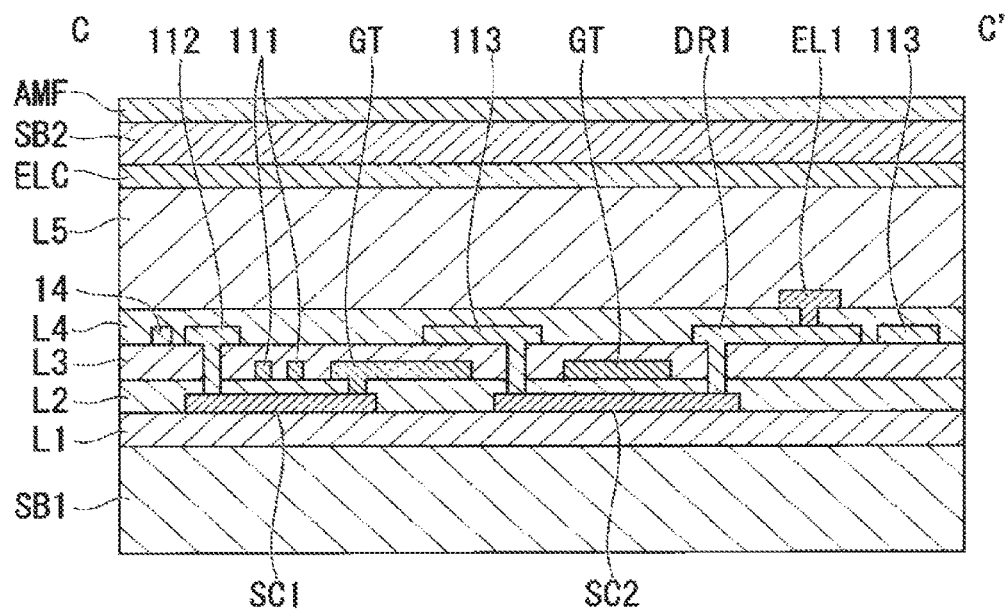
FIG. 6 is a sectional view illustrating a sectional structure of the arbitrary sub-pixel in the organic EL display device according to the first embodiment.

FIG. 6 illustrates a sectional structure taken along a section C-C' in FIG. 5. A line interconnecting C and C' in FIG. 5 passes the upper- and lower-pattern connecting portions VI1, VI2, VI3, VI4 and VI5 in the mentioned order.

Figure 7:
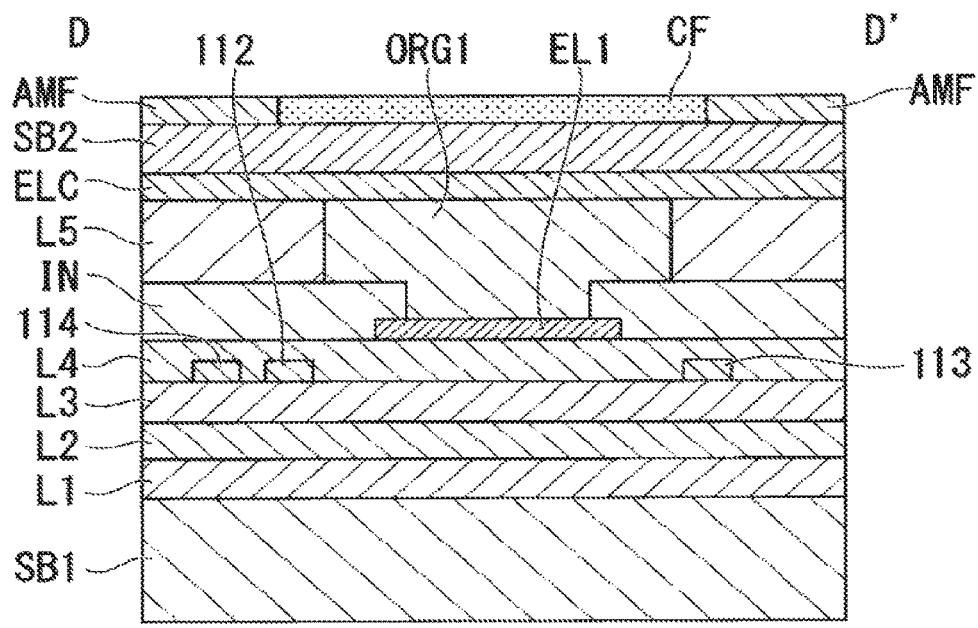
FIG. 7 is a sectional view illustrating a sectional structure of the sub-pixel in the organic EL display device according to the first embodiment.

As illustrated in FIGS. 6 and 7, the organic EL display device 100 includes a substrate SB1, and further includes an underlying layer L1, a gate insulating film L2, an interlayer film L3, a planarizing film L4, a functional layer L5, a counter electrode ELC, a sealing layer SB2, an unmatched filter AMF, and a color filter CF, those components being successively formed on the substrate SB1.

The substrate SB1 is formed of, e.g., a glass substrate. The underlying layer L1 is formed by being laminated on the substrate SB1.

The semiconductor regions SC1 and SC2 are formed on the underlying layer L1. The gate insulating film L2 is formed by being laminated on the underlying layer L1. The gate insulating film L2 covers the semiconductor regions SC1 and SC2. The branch portion G1 is formed above the semiconductor region SC1 with the gate insulating film L2 interposed therebetween. The branch portion G1 is electrically insulated from the semiconductor region SC1 with the presence of the gate insulating film L2. Thus, the branch portion G1 is able to function as the gate electrode in the first thin film transistor 131 (see FIG. 2). The one end portion of the intermediate wiring line GT is formed above the semiconductor region SC2 with the gate insulating film L2 interposed therebetween. The intermediate wiring line GT is electrically insulated from the semiconductor region SC2 with the presence of the gate insulating film L2. It is to be noted that, although the first scanning line 111 has a double-gate shape in the drawing, the shape of the first scanning line 111 is not limited to the illustrated shape.

A via in the form of a fine hole is formed in the upper- and lower-pattern connecting portion VI2 between the semiconductor region SC1 and the intermediate wiring line GT to extend in the direction of thickness of the gate insulating film L2. The intermediate wiring line GT is contacted with the semiconductor region SC1 through the upper- and lower-pattern connecting portion VI2.

The interlayer film L3 is formed by being laminated on the gate insulating film L2. The interlayer film L3 covers the first scanning line 111 and the gate wiring line GT. The data line 112, the power line 113, and the intermediate wiring line DR1 are formed on the interlayer film L3. A via is formed in the upper- and lower-pattern connecting portion VI1 between the semiconductor region SC1 and the data line 112 to extend in the direction of thickness of both the interlayer film L3 and the gate insulating film L2. The data line 112 is contacted with the semiconductor region SC1 through the upper- and lower-pattern connecting portion VI1.

A via is formed in the upper- and lower-pattern connecting portion VI3 between the semiconductor region SC2 and the power line 113 to extend in the direction of both thickness of the interlayer film L3 and the gate insulating film L2. The power line 113 is contacted with the semiconductor region SC2 through the upper- and lower-pattern connecting portion VI3.

A via is formed in the upper- and lower-pattern connecting portion VI4 between the semiconductor region SC2 and the intermediate wiring line DR1 to extend in the direction of thickness of both the interlayer film L3 and the gate insulating film L2. The intermediate wiring line DR1 is contacted with the semiconductor region SC2 through the upper- and lower-pattern connecting portion VI4.

A part of the interlayer film L3 is sandwiched between the intermediate wiring line GT and the power line 113, and it forms the capacitance element 133. The capacitance of the capacitance element 133 is preferably set to a larger value in order that the driving signal of the first organic EL element 140 is held for a sufficiently long time by the capacitance element 133. In other words, a material of the interlayer film L3 preferably has a higher dielectric constant. Moreover, the distance from the intermediate wiring line GT to the power line 113 is preferably set as short as possible within a range not causing insulation breakdown. In addition, the intermediate wiring line GT and the power line 113 preferably overlap with each other over an area as large as possible when looking at them in the plan view (see FIG. 5).

The planarizing film L4 is formed by being laminated on the interlayer film L3. The planarizing film L4 covers the data line 112, the power line 113, the measurement line 115, and the intermediate wiring line DR1. The electrode EL1 is formed on the planarizing film L4. A via is formed in the upper- and lower-pattern connecting portion VI5 between the intermediate wiring line DR1 and the electrode EL1 to extend in the direction of thickness of the planarizing film L4. The electrode EL1 is contacted with the intermediate wiring line DR1 through the upper- and lower-pattern connecting portion VI5.

The functional layer L5 is disposed on the planarizing film L4. Though not appeared in the section C-C' illustrated in FIG. 6, the functional layer L5 includes an organic thin film adapted to form an organic EL element, an insulating cover adapted to cover electrode edges, and a partition wall adapted to keep the adjacent sub-pixels apart from each other.

The counter electrode ELC is disposed on the functional layer L5. The counter electrode ELC is connected to the not-illustrated common wiring line, thus setting potentials of all the cathodes of the first organic EL elements 140 to the common potential $V_{COM}$. The counter electrode ELC is, for example, one electrode formed in a state covering an entire surface of the display region 110 (see FIG. 2). The sealing layer SB2 is formed by being laminated on the counter electrode ELC. The color filter CF and the unmatched filter AMF are disposed on the sealing layer SB2 with an adhesive layer or a gas barrier layer interposed therebetween though not illustrated.

FIG. 7 illustrates a sectional structure taken along a section D-D' in FIG. 5. A line interconnecting D and D' in FIG. 5 passes through the organic thin film ORG1 forming the first organic EL element 140.

As illustrated in FIG. 7, an insulating cover IN made of an insulator is disposed at the edges of the electrode EL1. The organic thin film ORG1 is formed by being laminated on the electrode EL1 and the insulating cover IN. The organic thin film ORG1 is sandwiched between the electrode EL1 and the counter electrode ELC.

Figure 8:
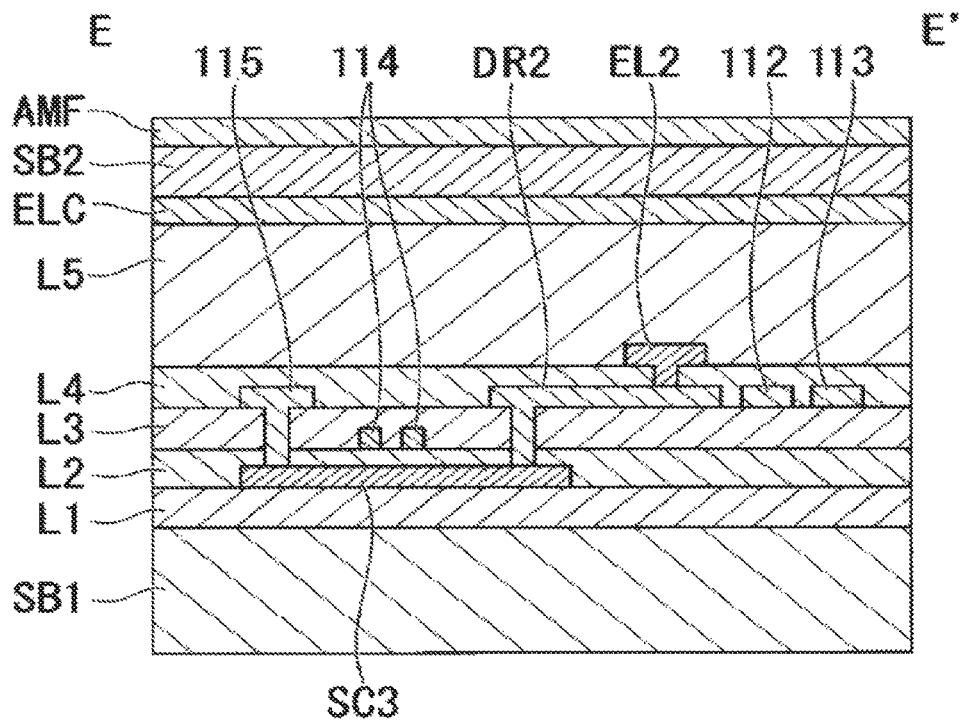
FIG. 8 is a sectional view illustrating a sectional structure of the sub-pixel in the organic EL display device according to the first embodiment.

FIG. 8 illustrates a sectional structure taken along a section E-E' in FIG. 5. A line interconnecting E and E' in FIG. 5 passes the upper- and lower-pattern connecting portions VI6, VI7 and VI8 in the mentioned order.

As illustrated in FIG. 8, the semiconductor region SC3 is formed on the underlying layer L1. The gate insulating film L2 covers the semiconductor region SC3. The branch portion G3 is formed above the semiconductor region SC3 with the gate insulating film L2 interposed therebetween. The branch portion G3 is electrically insulated from the semiconductor region SC3 with the presence of the gate insulating film L2. Although the branch portion G3 has a double-gate shape in the drawing, the shape of the branch portion G3 is not limited to the illustrated shape.

The measurement line 115 is formed on the interlayer film L3. A via is formed in the upper- and lower-pattern connecting portion VI6 between the semiconductor region SC3 and the measurement line 115 to extend in the direction of thickness of both the interlayer film L3 and the gate insulating film L2. The measurement line 115 is contacted with the semiconductor region SC3 through the upper- and lower-pattern connecting portion VI6.

The intermediate wiring line DR2 is formed on the interlayer film L3. A via is formed in the upper- and lower-pattern connecting portion VI7 between the semiconductor region SC3 and the intermediate wiring line DR2 to extend in the direction of thickness of both the interlayer film L3 and the gate insulating film L2. The intermediate wiring line DR2 is contacted with the semiconductor region SC3 through the upper- and lower-pattern connecting portion VI7.

The electrode EL2 is formed on the planarizing film L4. A via is formed in the upper- and lower-pattern connecting portion VI8 between the intermediate wiring line DR2 and the electrode EL2 to extend in the direction of thickness of the planarizing film L4. The electrode EL2 is contacted with the intermediate wiring line DR2 through the upper- and lower-pattern connecting portion VI8.

Figure 9:
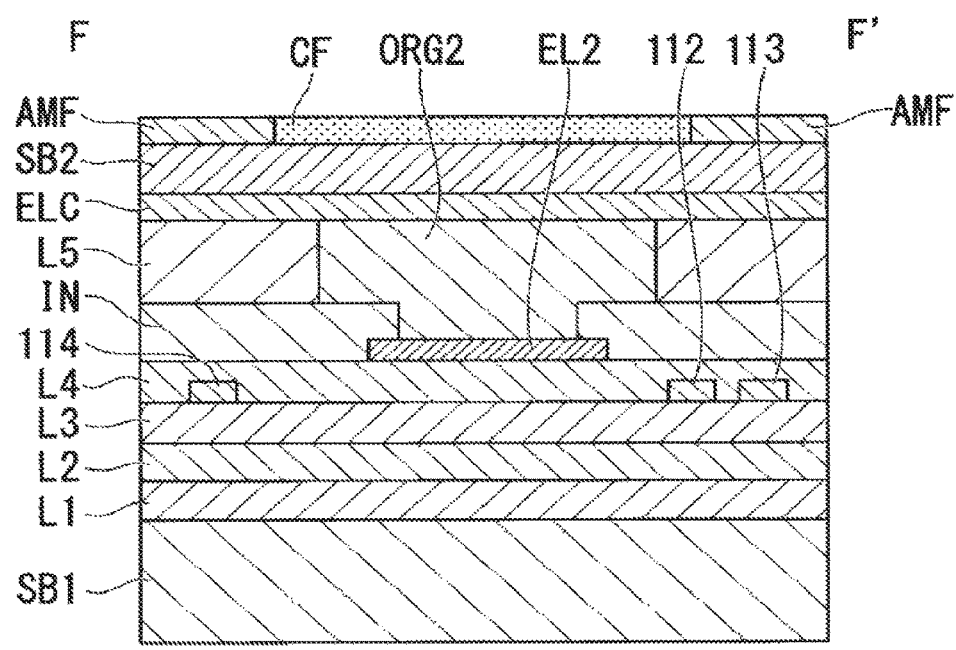
FIG. 9 is a sectional view illustrating a sectional structure of the sub-pixel in the organic EL display device according to the first embodiment.

FIG. 9 illustrates a sectional structure taken along a section F-F' in FIG. 5. A line interconnecting F and F' in FIG. 5 passes the organic thin film ORG2 forming the second organic EL element 150.

As illustrated in FIG. 9, an insulating cover IN made of an insulator is disposed at the edges of the electrode EL2. The organic thin film ORG2 is formed by being laminated on the electrode EL2 and the insulating cover IN. The organic thin film ORG2 is sandwiched between the electrode EL2 and the counter electrode ELC.

FIG. 10 is a plan view of the pixel 120 according to this embodiment. FIGS. 11A, 11B and 11C are sectional views, taken along a section A-A' (see FIG. 5), of the sub-pixels 130R, 130G and 130B, respectively. A line interconnecting A and A' in FIG. 5 passes the upper- and lower-pattern connecting portions VI2, VI3, VI5, VI7 and VI8 in the mentioned order.

In this embodiment, the organic EL display device 100 is of the top emission type. In this embodiment, the first organic EL element 140 and the second organic EL element 150 (see FIG. 2) have the common organic thin film ORGW in all the sub-pixels 130R, 130G and 130B.

The organic thin film ORGW is made of a material emitting white light. Here, the term "white light" is not limited to light containing visible lights of all wavelengths at equal proportions, and it may be light containing red, green and blue lights at appropriate proportions such that the light is visually perceived to be white by the human eyes.

As illustrated in FIG. 10, the color filter CF is selectively disposed in each of the sub-pixels 130R, 130G and 130B at a position opposing to the first organic EL element. More specifically, a red color filter RF, a green color filter GF, and a blue color filter BF are disposed corresponding to colors displayed by the sub-pixels 130R, 130G and 130B, respectively. As illustrated in FIGS. 11A, 11B and 11C, the color filters RF, GF and BF are disposed so as to cover the respective electrodes EL1 included in the sub-pixels 130R, 130G and 130B. As a result, the sub-pixels 130R, 130G and 130B emit red, green and blue lights, respectively.

As illustrated in FIGS. 10 and 11A to 11C, the unmatched filter AMF is disposed in a region of a surface covering the pixel 120 where the color filters CF are not disposed. The unmatched filter AMF is a complementary filter with respect to the above-mentioned white light. The unmatched filter AMF is a light absorbing member arranged in an opposing relation to the second organic EL element 150 (see FIG. 2), and it functions as a light shielding member. With the presence of the unmatched filter AMF, the light emitted from the second organic EL element 150, which is used as a temperature sensor, can be suppressed from leaking to the outside. As a result, the temperature sensor can develop its function without degrading display quality of the organic EL display device 100.

The first embodiment of the present invention has been described above. According to the configuration of the first embodiment, the temperature information detector 160 detects the temperature information of the second organic EL element 150 included in each of the sub-pixels 130. Since the first organic EL element 140 and the second organic EL element 150 both arranged in the same sub-pixel 130 are close to each other, the temperature information of the second organic EL element 150 can be regarded as being approximate to that of the first organic EL element 140 arranged in the same sub-pixel 130. Therefore, proper correction of the driving signal in consideration of temperature change can be made for each of the sub-pixels 130 by correcting the driving signal of the first organic EL element 140, which is arranged in the same sub-pixel 130 as the second organic EL element 150, on the basis of the temperature information of the second organic EL element 150. Hence the organic EL display device 100 having high display quality is provided.

[First Modification]

In the first embodiment, the first organic EL element 140 and the second organic EL element 150 (see FIG. 2) both included in the same sub-pixel 130 may have different organic thin films.

Figure 12:
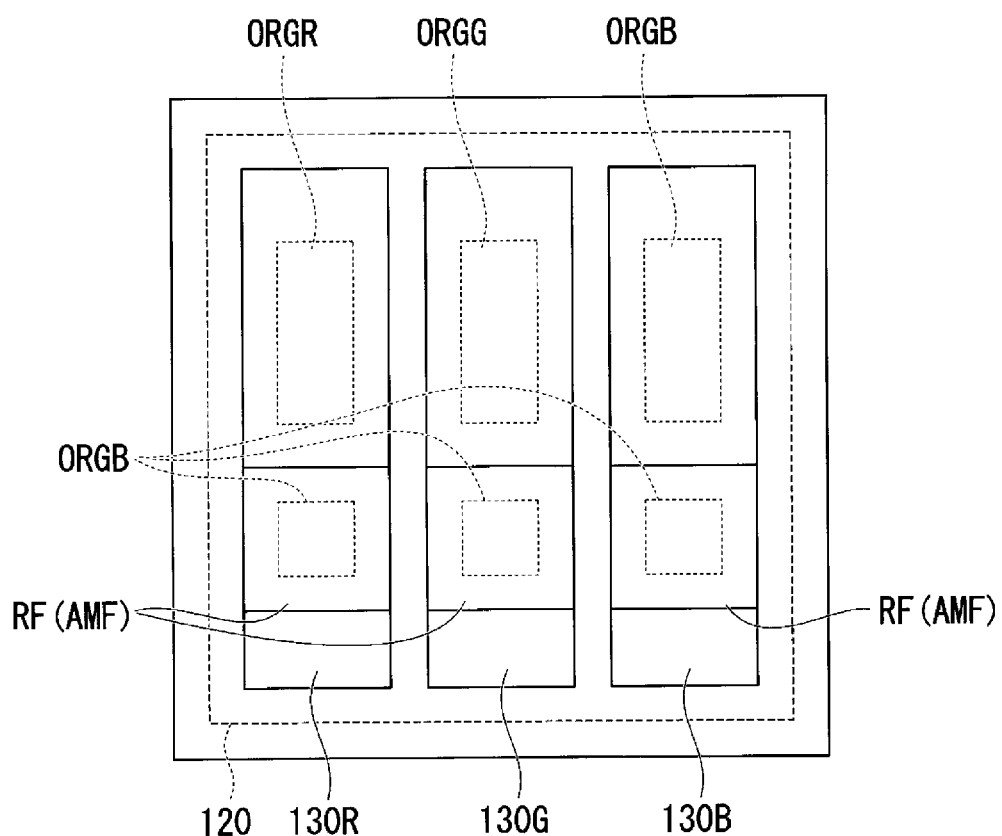
FIG. 12 is a plan view illustrating a planar structure of a pixel in an organic EL display device according to a first modification of the first embodiment.

FIG. 12 is a plan view of a pixel in a first modification. The first organic EL element 140 included in the sub-pixel 130R is formed of a red luminescent material ORGR. The first organic EL element 140 included in the sub-pixel 130G is formed of a green luminescent material ORGG. The first organic EL element 140 included in the sub-pixel 130B is formed of a blue luminescent material ORGB. The second organic EL elements 150 are formed of the same luminescent material, e.g., the blue luminescent material ORGB, in all the sub-pixels 130. Thus, respective temperature dependencies of the current-voltage characteristics of the second organic EL elements 150 included in the individual sub-pixels 130 are equal to one another. The organic materials ORGR, ORGG and ORGB are vapor-deposited in patterns at positions where the first organic EL elements 140 in the sub-pixels 130R, 130G and 130B are to be formed, respectively. The organic material ORGB is vapor-deposited in patterns at positions where the second organic EL element 150 in all the sub-pixels 130 are to be formed.

Figure 13A:
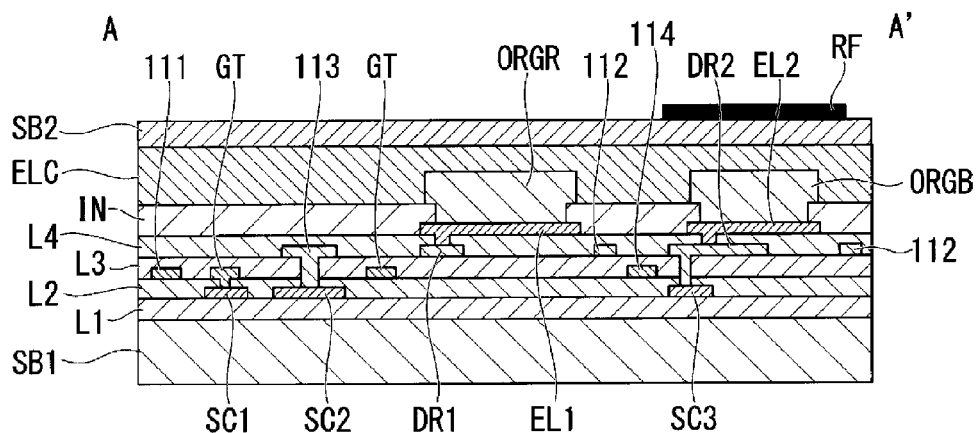
FIG. 13A is a first sectional view illustrating a sectional structure of the pixel in the organic EL display device according to the first modification of the first embodiment.
Figure 13B:
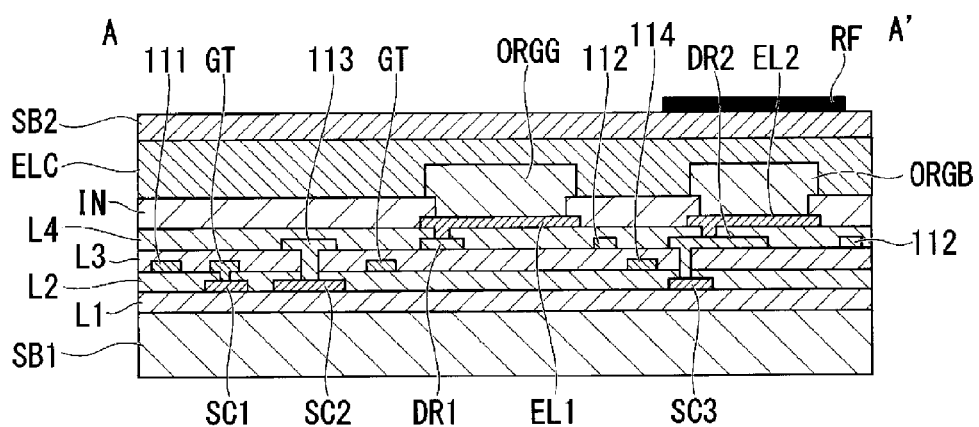
FIG. 13B is a second sectional view illustrating a sectional structure of the pixel in the organic EL display device according to the first modification of the first embodiment.
Figure 13C:
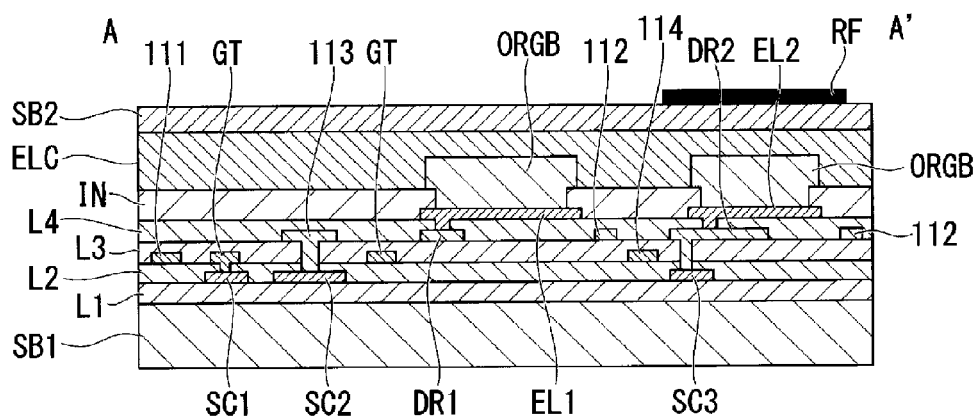
FIG. 13C is a third sectional view illustrating a sectional structure of the pixel in the organic EL display device according to the first modification of the first embodiment.

FIGS. 13A, 13B and 13C are sectional views, taken along the section A-A' (see FIG. 5), of the sub-pixels 130R, 130G and 130B, respectively. The color filters CF are not required to be disposed right above the electrodes FL1 providing display portions of the sub-pixels 130. Furthermore, since temperature sensor portions are each formed of the common organic thin film ORGB, one type of unmatched filter AMF (RF) having a complementary color with respect to blue light is just required.

[Second Modification]

Figure 14:
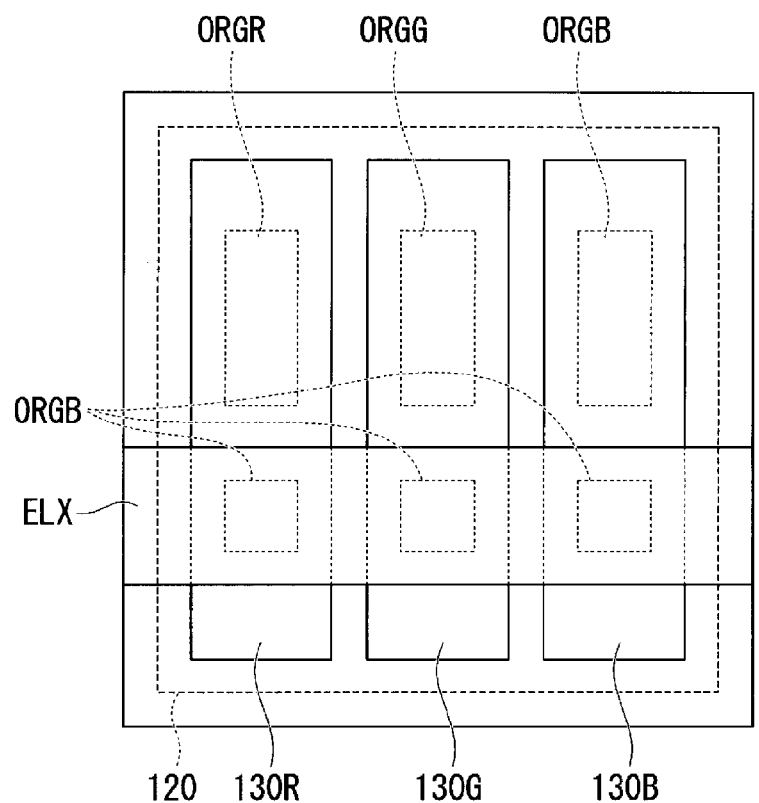
FIG. 14 is a plan view illustrating a planar structure of a pixel in an organic EL display device according to a second modification of the first embodiment.
Figure 15A:
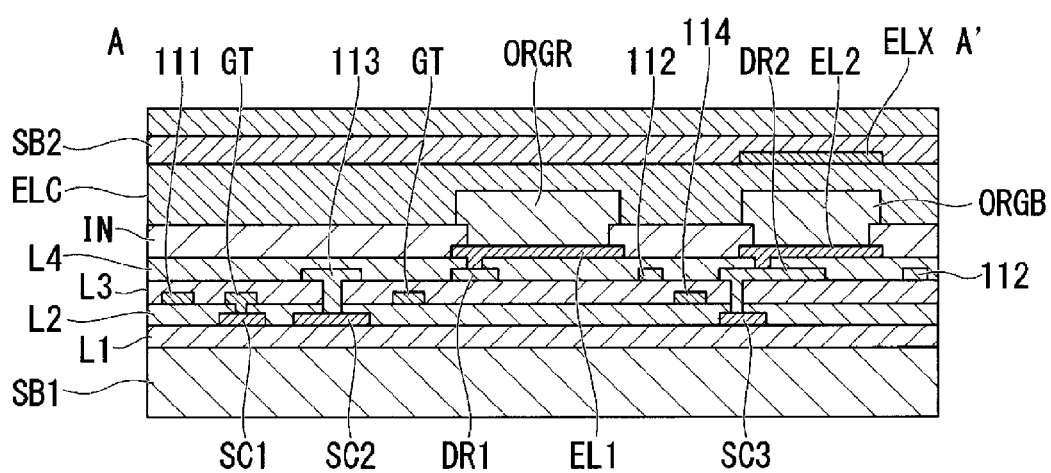
FIG. 15A is a first sectional view illustrating a sectional structure of the pixel in the organic EL display device according to the second modification of the first embodiment.

In the first embodiment, leaking of the lights from the second organic EL elements 150R, 150G and 150B to the display region 110 (see FIG. 2) can also be suppressed by providing an electrode ELX in an overlapping relation to the electrode, which is included in each of the second organic EL elements 150, without using the color filter CF. FIG. 14 is a plan view of a pixel in a second modification. FIG. 15A is a sectional view, taken along the section A-A' (see FIG. 5), of the sub-pixel 130. The organic EL display device is of the top emission type. It is to be noted that, in FIGS. 15A to 15C, the sub-pixel 130 is represented by 130R.

The electrode ELX is provided on the counter electrode ELC corresponding to the electrode EL2 in an overlapping relation. With the provision of the electrode ELX, a thickness of the electrode positioned above the second organic EL element 150 increases, and transmittance of light reduces. Accordingly, the light emitted from the second organic EL element 150 (see FIG. 2) used as the temperature sensor can be suppressed from leaking to the outside.

Figure 15B:
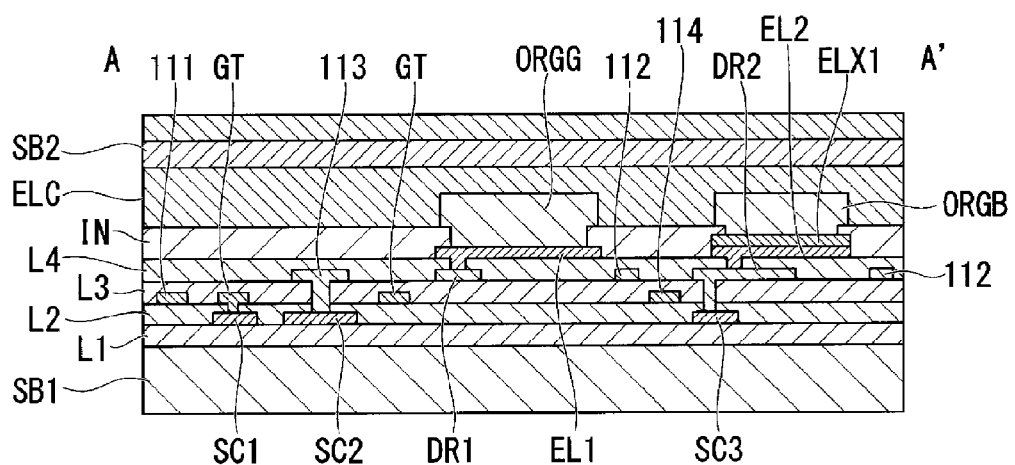
FIG. 15B is a second sectional view illustrating a sectional structure of the pixel in the organic EL display device according to the second modification of the first embodiment.

In the case of the bottom emission type, as illustrated in FIG. 15B, an electrode ELX1 is provided under the electrode EL2 in an overlapping relation. With the provision of the electrode ELX1, a thickness of the electrode positioned under each of the second organic EL elements 150R, 150G and 150B increases, and transmittance of light reduces. Accordingly, the light emitted from the second organic EL element 150 (see FIG. 2) used as the temperature sensor can be suppressed from leaking to the outside.

Figure 15C:
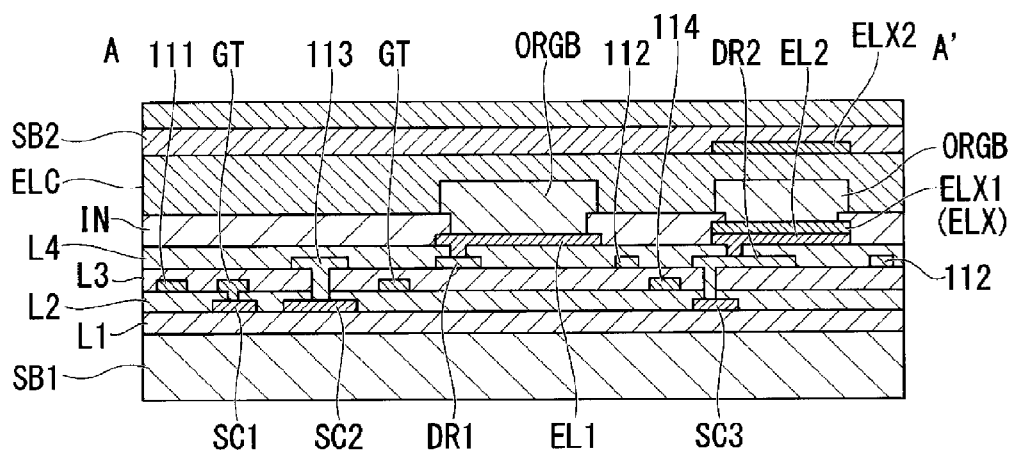
FIG. 15C is a third sectional view illustrating a sectional structure of the pixel in the organic EL display device according to the second modification of the first embodiment.

In the case of the double emission type, as illustrated in FIG. 15C, an electrode ELX2 is disposed on the counter electrode ELC and the electrode ELX1 is provided under the electrode EL2. With the provision of the electrodes ELX1 and ELX2, a thickness of the electrode positioned under each of the second organic EL elements 150R, 150G and 150B increases, and transmittance of light reduces. Accordingly, the light emitted from the second organic EL element 150 (see FIG. 2) used as the temperature sensor can be suppressed from leaking to the outside.

[Second Embodiment]

Figure 16:
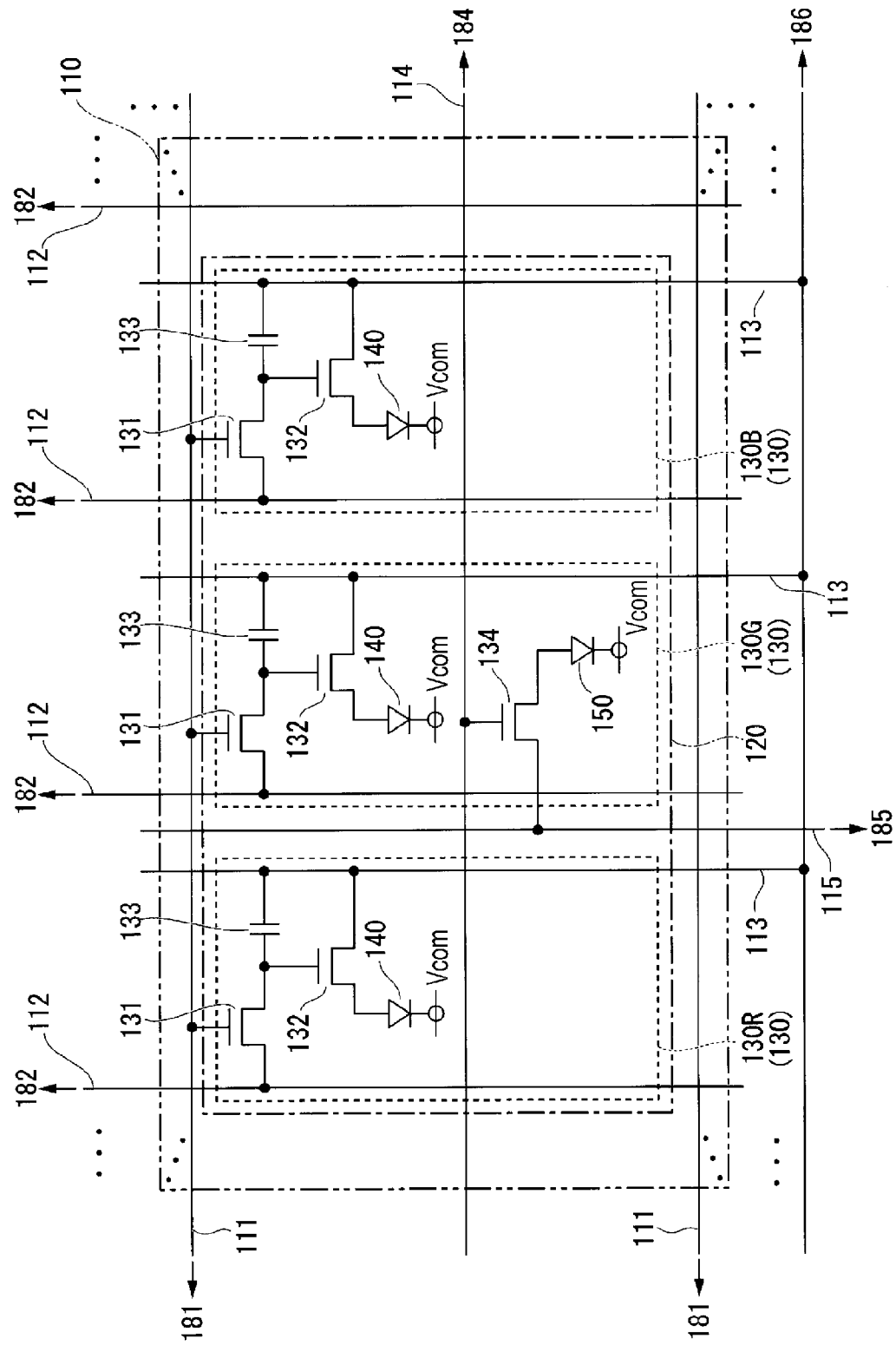
FIG. 16 is an equivalent circuit diagram illustrating a circuit configuration of a pixel in an organic EL display device according to a second embodiment.
Figure 17:
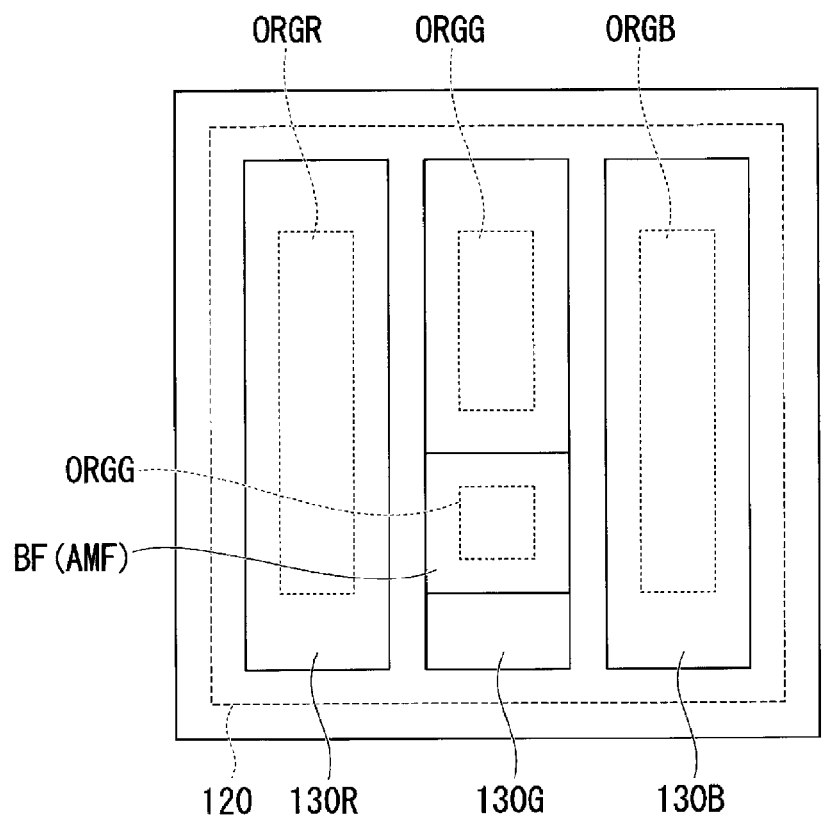
FIG. 17 is a plan view illustrating a planar structure of the pixel in the organic EL display device according to the second embodiment.
Figure 18:
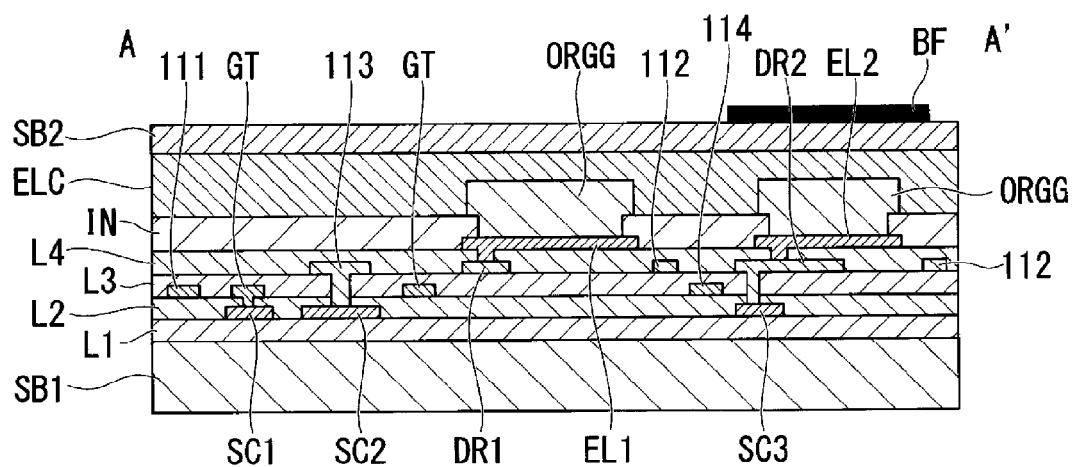
FIG. 18 is a sectional view illustrating a sectional structure of a sub-pixel in the organic EL display device according to the second embodiment.

A second embodiment of the present invention will be described below with reference to FIGS. 16 to 18. FIG. 16 is a circuit diagram illustrating a circuit configuration of a pixel 120 in this embodiment. FIG. 17 is a plan view illustrating a planar structure of the pixel 120. FIG. 18 is a sectional view illustrating a sectional structure of a sub-pixel 130G. In the following, the same components as those in FIGS. 1 to 15C are denoted by the same reference signs, and description of those components is omitted.

As illustrated in FIG. 16, in the second embodiment, only the sub-pixel 130G among the three types of sub-pixels 130R, 130G and 130B includes the second organic EL element 150. The second embodiment is greatly different from the first embodiment in the above point.

In more detail, each of the pixels 120 includes a plurality of first organic EL elements 140 and a second organic EL element 150. The temperature information detector 160 (see FIG. 1) measures current-voltage characteristics of the second organic EL element 150 included in each of the pixels 120, and detects, on the basis of a result of the measurement, temperature information of the second organic EL element 150 included in each of the pixels 120. The control unit 170 (see FIG. 1) corrects respective driving signals of the first organic EL elements 140, the first organic EL elements 140 being included in each of the pixels 120, on the basis of the temperature information of the second organic EL element 150 included in the same pixel 120 as that including the relevant first organic EL elements 140.

The temperature information detector 160 (see FIG. 1) includes a plurality of second scanning lines 114 disposed adjacent to each other; a plurality of measurement lines 115 disposed adjacent to each other, the measurement lines 115 intersecting the second scanning lines 114; a plurality of third thin film transistors 134 disposed respectively corresponding to intersected portions where the second scanning lines 114 and the measurement lines 115 intersect, the third thin film transistors 134 being electrically connected to the second organic EL elements 150 included in the pixels 120, respectively; a scanning line driving circuit 184 configured to sequentially supply a gate signal to the second scanning lines 114; a measurement line driving circuit 185 configured to sequentially supply a constant current to the measurement lines 115; a voltage detection circuit 187 configured to sequentially measure, for each of the measurement lines 115, a potential difference between a potential of the measurement line 115 supplied with the current and a common potential of the second organic EL element 150 supplied with the current from the relevant measurement line 115, and to detect the differential potential as a voltage applied to the second organic EL element 150 supplied with the current from the relevant measurement line 115; a storage unit 188 configured to store data regarding temperature dependency of current-voltage characteristics of the second organic EL element 150 included in each of the pixels 120; and a detection unit 189 configured to detect, on the basis of the stored data, temperature information of the second organic EL element 150, supplied with the current from the measurement line 115, in accordance with the voltage detected by the voltage detection circuit 187.

The pixel 120 includes a first sub-pixel 130R, a second sub-pixel 130G, and a third sub-pixel 130B. The first sub-pixel 130R includes the first organic EL element 140. The first sub-pixel 130R emits red light with driving of the first organic EL element 140 included in the first sub-pixel 130R. The second sub-pixel 130G includes the first organic EL element 140 and the second organic EL element 150. The second sub-pixel 130G emits green light with driving of the first organic EL element 140 included in the second sub-pixel 130G. The third sub-pixel 130B includes the first organic EL element 140. The third sub-pixel 130B emits blue light with driving of the first organic EL element 140 included in the third sub-pixel 130B.

An organic EL display device driving method according to this embodiment is a method of driving the organic EL display device including the plurality of pixels 120, each of the pixels including the plurality of first organic EL elements 140 and the second organic EL element 150, the method including a current and voltage measuring step of measuring current-voltage characteristics of the second organic EL element 150 included in each of the pixels 120; a temperature information detecting step of detecting, on the basis of a measurement result obtained in the current and voltage measuring step, temperature information of the second organic EL element 150 included in each of the pixels 120; and a driving signal correcting step of correcting respective driving signals of the first organic EL elements 140, the first organic EL elements 140 being included in each of the pixels 120, on the basis of the temperature information of the second organic EL element 150 included in the same pixel 120 as the pixel 120 including the relevant first organic EL elements 140.

In this embodiment, only the first organic EL element 140 is included in each of the sub-pixels 130R and 130B. Therefore, as illustrated in FIG. 17, the organic thin films ORGR and ORGB forming the first organic EL elements 140 in the sub-pixels 130R and 130B can be formed over large areas in the sub-pixels 130R and 130B, respectively.

In the sub-pixel 130G, because an area for the second organic EL element 150G is required, an area of the organic thin film ORGG forming the first organic EL element 140 is smaller than that of each of ORGR and ORGB. The second organic EL element 150 is formed of the organic thin film ORGG as in the first organic EL element 140. Accordingly, respective temperature dependencies of the current-voltage characteristics of the second organic EL elements 150 included in the individual pixels 120 are equal to one another. As illustrated in FIG. 18, the unmatched filter AMF (BF) having a color complementary to green is disposed only in a portion right above the electrode EL2 in the sub-pixel 130G in order to shield the light emitted from the second organic EL element 150.

According to the configuration described above, the temperature information detector 160 detects the temperature information of the second organic EL element 150 included in each of the pixels 120. Since the first organic EL elements 140 and the second organic EL element 150 all arranged in the same pixel 120 are close to each other, the temperature information of the second organic EL element 150 can be regarded as being approximate to that of each of the first organic EL elements 140 arranged in the same pixel 120. Therefore, proper correction of the driving signal in consideration of temperature change can be made for each of the pixels 120 by correcting the driving signal of each of the first organic EL elements 140, the first organic EL elements 140 being arranged in the same pixel 120, on the basis of the temperature information of the second organic EL element 150. Hence the organic EL display device having high display quality is provided.

Furthermore, according to the configuration described above, the temperature sensor is formed in a state that the sub-pixel 130G emitting green light has a relatively small luminescent region. However, because spectral sensitivity of the human eye is relatively high to green, the green light has greater capacity in luminance and lifetime than the other luminescent lights (red and blue). For that reason, even when the temperature sensor is disposed in a portion of the sub-pixel 130G emitting the green light, it is possible to suppress a reduction of panel performance, such as lowering of the luminance and deterioration of the lifetime.

[Third Embodiment]

Figure 19:
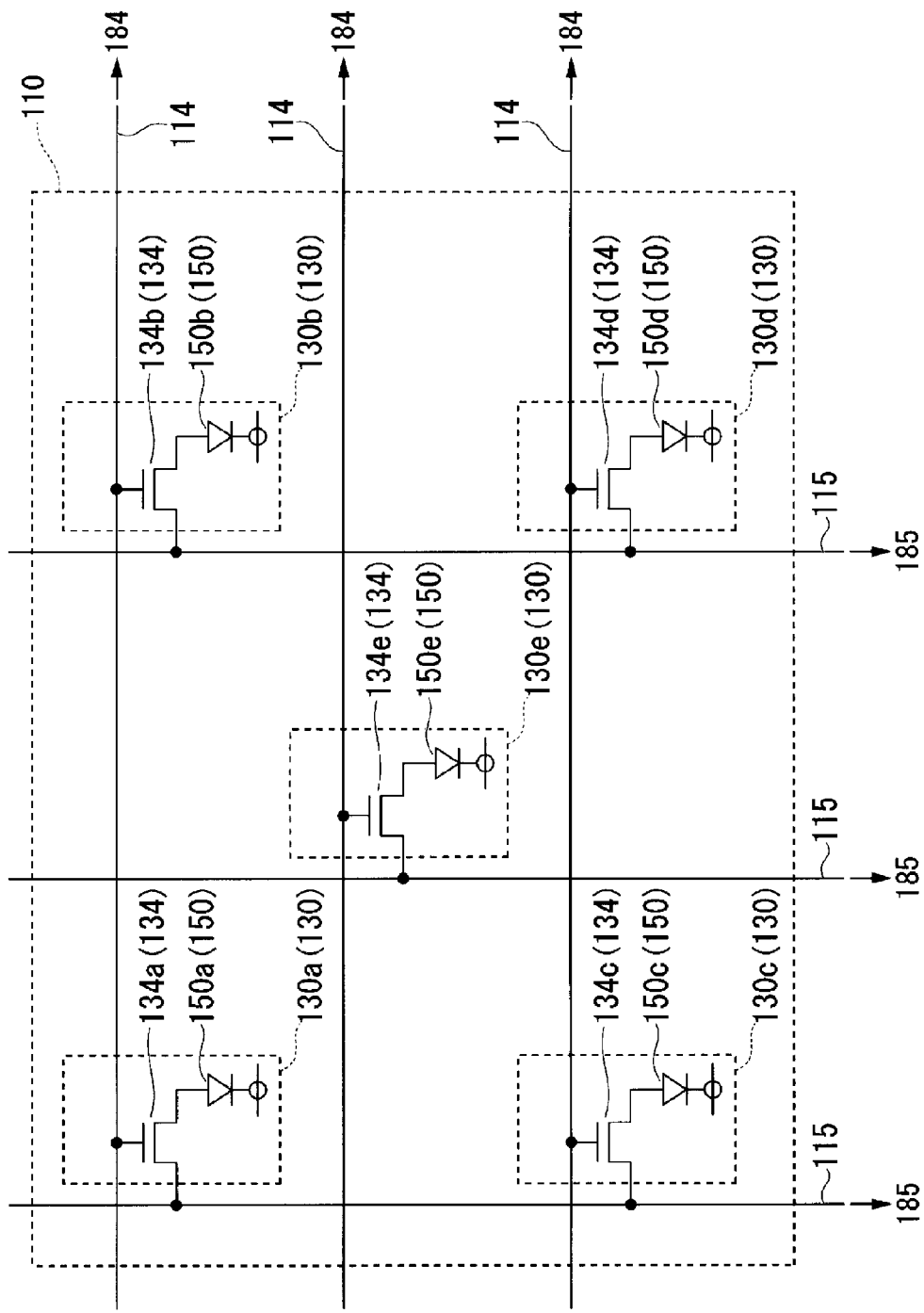
FIG. 19 is an equivalent circuit diagram illustrating a layout of temperature sensors in an organic EL display device according to a third embodiment.

A third embodiment of the present invention will be described below with reference to FIG. 19. FIG. 19 is a circuit diagram illustrating a layout of temperature sensors in an organic EL display device according to this embodiment. It is to be noted that, in FIG. 19, the first organic EL elements are not illustrated. In this embodiment, the temperature sensors are arranged only at some representative points in the display region 110, e.g., at a center point and four corner points. The third embodiment is greatly different from the first and second embodiments in the above point.

In more detail, the organic EL display device includes a plurality of sub-pixels 130 each including a first organic EL element; one or more second organic EL elements 150; a temperature information detector configured to measure current-voltage characteristics of the one or more second organic EL elements 150, and to detect, on the basis of a result of the measurement, temperature information of the one or more second organic EL elements 150; and a correction unit configured to correct driving signals of the first organic EL elements 140, the first organic EL elements 140 being included respectively in the individual sub-pixels 130, on the basis of the temperature information of the one or more second organic EL elements 150.

The second organic EL element 150 is disposed plural. The temperature information detector includes a plurality of second scanning lines 114 disposed adjacent to each other; a plurality of measurement lines 115 disposed adjacent to each other, the measurement lines 115 intersecting the second scanning lines 114; a plurality of third thin film transistors 134 disposed respectively corresponding to intersected portions where the second scanning lines 114 and the measurement lines 115 intersect, the third thin film transistors 134 being electrically connected to the second organic EL elements 150, respectively; a scanning line driving circuit 184 configured to sequentially supply a gate signal to the second scanning lines 114; a measurement line driving circuit 185 configured to sequentially supply a constant current to the measurement lines 115; a voltage detection circuit configured to sequentially measure, for each of the measurement lines 115, a potential difference between a potential of the measurement line 115 supplied with the current and a common potential of the second organic EL element 150 supplied with the current from the relevant measurement line 115, and to detect the differential potential as a voltage applied to the second organic EL element 150 supplied with the current from the relevant measurement line 115; a storage unit configured to store data regarding temperature dependency of current-voltage characteristics of the second organic EL elements; and a detection unit configured to detect, on the basis of the stored data, temperature information of the second organic EL element 150, the second organic EL element 150 being supplied with the current from the measurement line 115, in accordance with the voltage detected by the voltage detection circuit.

Furthermore, respective temperature dependencies of the current-voltage characteristics of the second organic EL elements 150 are equal to one another.

An organic EL display device driving method according to this embodiment is a method of driving an organic EL display device including the plurality of sub-pixels and the one or more second organic EL elements 150, each of the sub-pixels including the first organic EL element, the method including a current and voltage measuring step of measuring current-voltage characteristics of the one or more second organic EL elements 150; a temperature information detecting step of detecting, on the basis of a measurement result obtained in the current and voltage measuring step, temperature information of the one or more second organic EL elements 150; and a driving signal correcting step of correcting a driving signal of the first organic EL element, the first organic EL element being included in each of the sub-pixels, on the basis of the temperature information of the one or more second organic EL elements 150.

According to the configuration described above, temperature information of the organic EL display device can be indirectly detected on the basis of the temperature information of the one or more second organic EL elements 150. Therefore, proper correction of the driving signal in consideration of temperature change can be made by correcting the driving signal of the first organic EL element, the first organic EL element being included in each of the sub-pixels, on the basis of the above temperature information. Hence the organic EL display device having high display quality is provided.

While the preferred embodiments of the present invention have been described with reference to the attached drawings, it is needless to say that the present invention is not limited to those embodiments. The shapes, the combinations, and so on of the components, described in the above embodiments, are merely illustrative, and they can be variously modified in response to design demands and other factors within the scope not departing from the gist of the present invention.

[First Example]

FIRST EXAMPLE of the present invention will be described below with reference to FIGS. 10, 11A to 11C, and 20.

The device structure illustrated in FIGS. 10 and 11A to 11C was fabricated as follows. First, thin film transistors, wiring lines, an interlayer film, a lower electrode, and an edge cover were formed in known manners on a glass substrate with known methods.

Then, a white organic EL element was formed over at least an entire surface of a display region by a known method. The lower electrode was formed as a reflective electrode with a known method, and an upper electrode was formed as a very thin metal film. The upper electrode was thus made transparent. The lower electrode was provided by forming a pixel pattern of A1:100 nm with a known method, and by forming an ITO film of 10 nm on the pixel pattern with a known method. The upper electrode was formed in thickness of 20 nm with a vapor deposition process by doping Mg into Ag at a ratio of (10:1) after forming an organic EL layer.

Finally, a color filter substrate separately formed with a known method was bonded to the glass substrate in a correspondence relation to each pixel portion and each temperature sensor portion. The color filter substrate was bonded with a gap of 15 μm held between the color filter and the upper electrode. In addition, a device not including the bonded color filter substrate was fabricated as a comparison target.

Figure 20:
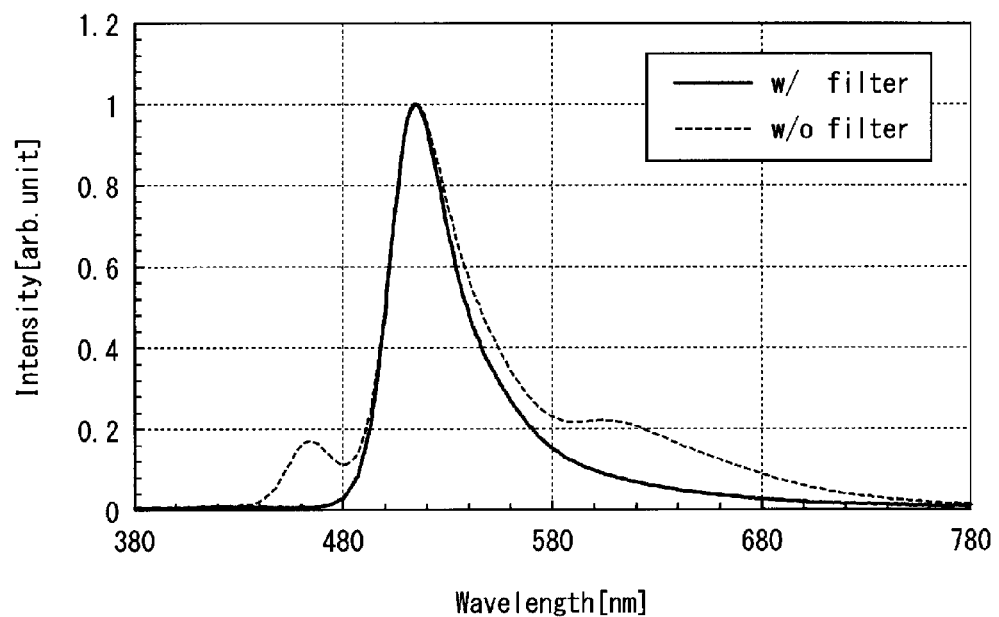
FIG. 20 is a graph plotting the result of FIRST EXAMPLE.

The device including the bonded color filter substrate and the device not including the bonded color filter substrate were operated to emit green light, and respective light emission spectra of both the devices were measured. FIG. 20 plots the measured results.

The device including the bonded color filter substrate is denoted by "w/ filter", and the device not including the bonded color filter substrate is denoted by "w/o filter".

In the device not including the color filter substrate, when the device was operated to emit green light, a color of light emitted from the temperature sensor portion (white in this EXAMPLE) was mixed with a panel displaying color, and degradation of display quality occurred. As a result of using the color filter, the light emitted from the temperature sensor portion was cut and was avoided from appearing on the display surface. Thus, a light emission spectrum of only green light could be obtained.

[Second Example]

SECOND EXAMPLE of the present invention will be described below with reference to FIGS. 12, 13A to 13C, and 21.

The device structure illustrated in FIGS. 12 and 13A to 13C was fabricated as follows. First, thin film transistors, various wiring lines, and an interlayer film were formed on a glass substrate with known methods.

A lower electrode was formed as a reflective electrode with a known method. An edge cover was formed with a known photoetch peeling process using a commercially available photosensitive material, the photosensitive material containing an acrylic resin, a novolac resin, and a phenol resin as main ingredients.

An organic EL layer was formed as a solid pattern over an area including at least a display region and each temperature sensor portion by a known vapor deposition process, thus providing the solid pattern of the organic EL layer except for luminescent layers. The luminescent layers were formed with a vapor deposition process by employing a vapor deposition mask formed in units of sub-pixel.

In this EXAMPLE, a film constituting the temperature sensor portion was formed only in the step of forming a blue luminescent layer, and the film constituting the temperature sensor portion was not formed in the steps of forming films of luminescent layers for the other colors. Stated in another way, a pattern of the temperature sensor portions was formed in the vapor deposition mask for use in the vapor deposition of the blue luminescent layer. However, the vapor deposition mask not having patterned openings corresponding to the temperature sensor portions was used in forming the films of red and green luminescent layers.

The upper electrode was formed as a very thin metal film, i.e., a transparent electrode. In this EXAMPLE, the upper electrode was formed in thickness of 20 nm with a vapor deposition process by doping Mg into Ag at a proportion of 10%. Thereafter, an unmatched-pattern formed substrate separately formed with a known method was bonded to the glass substrate in a correspondence relation to each pixel portion and each temperature sensor portion. The unmatched-pattern formed substrate was bonded with a gap of about 15 μm held between the unmatched-pattern formed substrate and the upper electrode.

Figure 21:
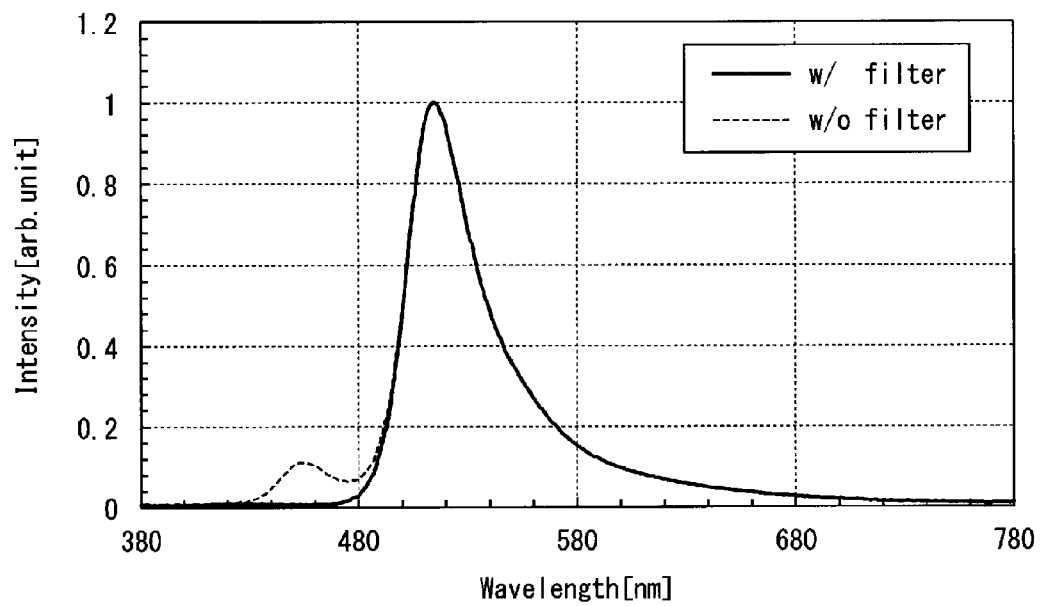
FIG. 21 is a graph plotting the result of SECOND EXAMPLE.

A device including the bonded color filter substrate and a device not including the bonded unmatched-pattern formed substrate were operated to emit green light, and respective light emission spectra of both the devices were measured. FIG. 21 plots the measured results.

The device including the bonded unmatched-pattern formed substrate is denoted by "w/ filter", and the device not including the bonded unmatched-pattern formed substrate is denoted by "w/o filter".

When the unmatched-pattern formed substrate was not bonded, a blue luminescence component emitted from the temperature sensor portion appeared to the display region, and a blue component also appeared in a light emission spectrum. Therefore, panel display quality degraded. When the unmatched-pattern formed substrate was bonded, the blue luminescence component emitted from the temperature sensor portion disappeared. Thus, an organic EL panel with high display quality could be obtained.

[Third Example]

Figure 22:
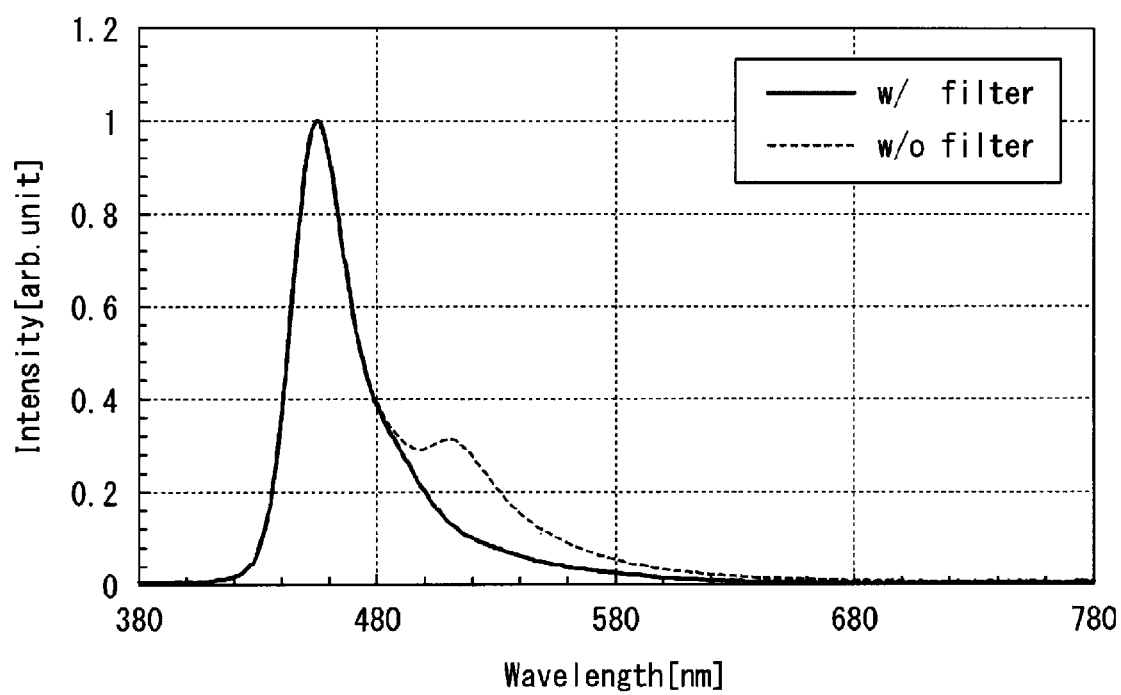
FIG. 22 is a graph plotting the result of THIRD EXAMPLE.

THIRD EXAMPLE of the present invention will be described below with reference to FIGS. 17, 18 and 22.

The device structure illustrated in FIGS. 17 and 18 was fabricated as follows. First, thin film transistors, wiring lines, an interlayer film, a lower electrode, and an edge cover were formed on a glass substrate with known methods.

Then, organic EL elements were formed over at least an entire surface of a display region by a known method. The lower electrode was formed as a reflective electrode with a known method. An upper electrode was formed as a very thin metal film such that the upper electrode was made transparent. In this EXAMPLE, the lower electrode was provided by forming a pixel pattern of A1:100 nm with a known method, and by forming an ITO film of 10 nm on the pixel pattern with a known method. The upper electrode was formed in thickness of 20 nm with a vapor deposition process by doping Mg into Ag at a ratio of (10:1) after forming an organic EL layer. Thereafter, a color filter substrate separately formed with a known method was bonded to the glass substrate in a correspondence relation to each pixel portion and each temperature sensor portion. The color filter substrate was bonded with a gap of 15 μm held between the color filter and the upper electrode.

FIG. 21 plots a light emission spectrum resulted when blue light was emitted from a display surface of a panel including the organic EL elements formed as described above. When the blue light was emitted in the case not including the filter, a color of light emitted from the temperature sensor portion (green in this EXAMPLE) was mixed with a panel displaying color, and degradation of display quality occurred. As a result of using the filter, the light emitted from the temperature sensor portion was cut by the unmatched color filter (blue in this EXAMPLE) and was avoided from appearing on the display surface. Thus, a light emission spectrum of only blue light could be obtained.

As described above, the present invention can provide the organic EL display device capable of correcting the light emission intensity with use of the temperature sensor without degrading the display quality.

INDUSTRIAL APPLICABILITY

The several aspects of the present invention can be each applied to an organic EL display device and a method of driving the organic EL display device, which are required to suppress a reduction of display quality, the reduction being caused by temperature change.

REFERENCE SIGNS LIST

100 . . . organic EL display device, 110 . . . image display region, 120 . . . pixel, 130 . . . sub-pixel, 140 . . . first organic EL element, 150 . . . second organic EL element, 160 . . . temperature information detector, 170 . . . control unit (correction unit), CF . . . color filter (light absorbing member), EC1, EL2 . . . anode, ELC . . . cathode, 114 . . . second scanning line (scanning line), 115 . . . measurement line, 134 . . . third thin film transistor (thin film transistor), 184 . . . scanning line driving circuit, 185 . . . measurement line driving circuit, 187 . . . voltage detection circuit, 188 . . . storage unit, 189 . . . detection unit, 130R . . . first sub-pixel, 130G . . . second sub-pixel, 130B . . . third sub-pixel, S1 . . . current and voltage measuring step, 52 . . . temperature information detecting step, 53 . . . driving signal correcting step

The invention claimed is:

1. An organic EL display device comprising:
sub-pixels each including a first organic EL element and a second organic EL element;
a temperature information detector that measures current-voltage characteristics of the second organic EL element included in each of the sub-pixels, and detects, on a basis of a measurement, temperature information of the second organic EL element included in each of the sub-pixels;
correction circuitry that corrects a driving signal of the first organic EL element included in each of the sub-pixels on a basis of the temperature information of the second organic EL element included in a same sub-pixel as a sub-pixel including corresponding first organic EL element; and
a light shield that shields light radiated from the second organic EL element toward a viewing side, wherein
the temperature information detector includes:
scanning lines disposed adjacent to each other;
measurement lines disposed adjacent to each other, the measurement lines intersecting the scanning lines;
thin film transistors disposed respectively corresponding to intersected portions where the scanning lines and the measurement lines intersect, the thin film transistors being electrically connected to the second organic EL elements included in individual sub-pixels, respectively;
a scanning line driving circuit that sequentially supplies a gate signal to the scanning lines;
a measurement line driving circuit that sequentially supplies a constant current to the measurement lines;
a voltage detection circuit that sequentially measures, for each of the measurement lines, a potential difference between a potential of a measurement line supplied with the current and a common potential of the second organic EL element supplied with the current from corresponding measurement line, and detects a differential potential as a voltage applied to the second organic EL element supplied with the current from the corresponding measurement line;
storage to circuitry that stores data regarding temperature dependency of the current-voltage characteristics of the second organic EL element included in each of the sub-pixels; and
detection circuitry that detects, on a basis of the stored data, the temperature information of the second organic EL element, the second organic EL element being supplied with the current from the corresponding measurement line, in accordance with the voltage detected by the voltage detection circuit.

2. The organic EL display device according to claim 1, wherein temperature dependencies of the current-voltage characteristics of the second organic EL elements included in the individual sub-pixels are equal to one another.

3. The organic EL display device according to claim 1, wherein the light shield includes a light absorber that opposes the second organic EL element.

4. The organic EL display device according to claim 1, wherein the light shield is defined by an anode or a cathode of the second organic EL element as a light reflecting electrode to reflect the light radiated from the second organic EL element.

5. The organic EL display device according to claim 1, wherein
the voltage detection circuit includes a first operational amplifier, a second operational amplifier, a first resistance, a second resistance, a third resistance, and an AD converter,
a non-inverting input terminal of the first operational amplifier is connected to the measurement line, an inverting input terminal of the first operational amplifier is connected to the common potential, an output terminal of the first operational amplifier is connected to one end of the first resistance,
another end of the first resistance is connected to a non-inverting input terminal of the second operational amplifier and to one end of the second resistance, and
an inverting input terminal of the second operational amplifier is connected to the common potential through the third resistance, an output terminal of the second operational amplifier is connected to another end of the second resistance and to an input terminal of the AD converter.

6. The organic EL display device according to claim 5, wherein a magnitude of the first resistance is less than a magnitude of the second resistance.

7. The organic EL display device according to claim 1, wherein the second organic EL element is driven at a constant current regardless of the driving signal.

8. An organic EL display device comprising:
pixels each including first organic EL elements and a second organic EL element;
a temperature information detector that measures current-voltage characteristics of the second organic EL element included in each of the pixels, and detects, on a basis of a measurement, temperature information of the second organic EL element included in each of the pixels;
correction circuitry that corrects driving signals of the first organic EL elements included in each of the pixels on a basis of the temperature information of the second organic EL element included in a same pixel as a pixel including corresponding first organic EL elements; and
a light shield that shields light radiated from the second organic EL element toward a viewing side, wherein
the temperature information detector includes:
scanning lines disposed adjacent to each other;
measurement lines disposed adjacent to each other, the measurement lines intersecting the scanning lines;
thin film transistors disposed respectively corresponding to intersected portions where the scanning lines and the measurement lines intersect, the thin film transistors being electrically connected to the second organic EL elements included in individual pixels, respectively;
a scanning line driving circuit that sequentially supplies a gate signal to the scanning lines;
a measurement line driving circuit that sequentially supplies a constant current to the measurement lines;
a voltage detection circuit that sequentially measures, for each of the measurement lines, a potential difference between a potential of a measurement line supplied with the current and a common potential of the second organic EL element supplied with the current from the corresponding measurement line, and detects a differential potential as a voltage applied to the second organic EL element supplied with the current from the corresponding measurement line;
storage circuitry that stores data regarding temperature dependency of the current-voltage characteristics of the second organic EL element included in each of the pixels; and
detection circuitry that detects, on a basis of the stored data, the temperature information of the second organic EL element, the second organic EL element being supplied with the current from the corresponding measurement line, in accordance with the voltage detected by the voltage detection circuit.

9. The organic EL display device according to claim 8, wherein temperature dependencies of the current-voltage characteristics of the second organic EL elements included in the individual pixels are equal to one another.

10. The organic EL display device according to claim 8, wherein
the pixels each include& a first sub-pixel, a second sub-pixel, and a third sub-pixel,
the first sub-pixel includes one of the first organic EL elements and emits red light when driving the one of the first organic EL elements included in the first sub-pixel,
the second sub-pixel includes one of the first organic EL elements and the second organic EL element, and emits green light when driving the one of the first organic EL elements included in the second sub-pixel; and
the third sub-pixel includes one of the first organic EL elements and emits blue light when driving the one of the first organic EL elements included in the third sub-pixel.

11. The organic EL display device according to claim 8, wherein each of the pixels includes a plurality of sub-pixels which display different colors,
wherein one of the sub-pixels includes only one of the first organic EL elements, and
wherein another of the sub-pixels includes another of the first organic EL elements and the second organic EL element.

12. The organic EL display device according to claim 11, wherein an area of the one of the first organic EL elements is larger than an area of the another of the first organic EL elements.

13. The organic EL display device according to claim 8, wherein
the voltage detection circuit includes a first operational amplifier, a second operational amplifier, a first resistance, a second resistance, a third resistance, and an AD converter,
a non-inverting input terminal of the first operational amplifier is connected to the measurement line, an inverting input terminal of the first operational amplifier is connected to the common potential, an output terminal of the first operational amplifier is connected to one end of the first resistance,
another end of the first resistance is connected to a non-inverting input terminal of the second operational amplifier and to one end of the second resistance, and
an inverting input terminal of the second operational amplifier is connected to the common potential through the third resistance, an output terminal of the second operational amplifier is connected to another end of the second resistance and to an input terminal of the AD converter.

14. The organic EL display device according to claim 13, wherein a magnitude of the first resistance is less than a magnitude of the second resistance.

15. An organic EL display device comprising:
sub-pixels each including a first organic EL element and a second organic EL element;
a temperature information detector that measures current-voltage characteristics of the second organic EL element included in each of the sub-pixels, and detects, on a basis of a measurement, temperature information of a second organic EL element included in each of the sub-pixels;
correction circuitry that corrects a driving signal of the first organic EL element included in each of the sub-pixels on a basis of the temperature information of the second organic EL element included in a same sub-pixel as a sub-pixel including a corresponding first organic EL element; and
a light shield that shields light radiated from the second organic EL element toward a viewing side, wherein the temperature information detector includes:
  scanning lines disposed adjacent to each other;
  measurement lines disposed adjacent to each other, the measurement lines intersecting the scanning lines;
  thin film transistors disposed respectively corresponding to intersected portions where the scanning lines and the measurement lines intersect, the thin film transistors being electrically connected to the second organic EL elements included in individual sub-pixels, respectively;
  a scanning line driving circuit that sequentially supplies a gate signal to the scanning lines;
  a measurement line driving circuit that sequentially supplies a constant current to the measurement lines;
  a voltage detection circuit that sequentially measures, for each of the measurement lines, a potential difference between a potential of a measurement line supplied with the current and a common potential of the second organic EL element supplied with the current from a corresponding measurement line, and detects a differential potential as a voltage applied to the second organic EL element supplied with the current from the corresponding measurement line;
  storage circuitry that stores data regarding temperature dependency of the current-voltage characteristics of the second organic EL element included in each of the sub-pixels; and
  detection circuitry that detects, on a basis of the stored data, the temperature information of the second organic EL element, the second organic EL element being supplied with the current from the corresponding measurement line, in accordance with the voltage detected by the voltage detection circuit,
the voltage detection circuit includes a first operational amplifier, a second operational amplifier, a first resistance, a second resistance, a third resistance, and an AD converter,
  a non-inverting input terminal of the first operational amplifier is connected to the measurement line, an inverting input terminal of the first operational amplifier is connected to the common potential, an output terminal of the first operational amplifier is connected to one end of the first resistance,
  another end of the first resistance is connected to a non-inverting input terminal of the second operational amplifier and to one end of the second resistance, and
  an inverting input terminal of the second operational amplifier is connected to the common potential through the third resistance, an output terminal of the second operational amplifier is connected to an other end of the second resistance and to an input terminal of the AD converter.

16. The organic EL display device according to claim 15, wherein temperature dependencies of the current-voltage characteristics of the second organic EL elements included in the individual sub-pixels are equal to one another.

17. The organic EL display device according to claim 15, wherein the light shield includes a light absorber that opposes the second organic EL element.

18. The organic EL display device according to claim 15, wherein the light shield is defined by an anode or a cathode of the second organic EL element as a light reflecting electrode to reflect the light radiated from the second organic EL element.

19. The organic EL display device according to claim 15, wherein a magnitude of the first resistance is less than a magnitude of the second resistance.

20. The organic EL display device according to claim 15, wherein the second organic EL element is driven at a constant current regardless of the driving signal.

* * * * *